United States Patent
Cho et al.

(10) Patent No.: US 7,701,235 B2
(45) Date of Patent: Apr. 20, 2010

(54) SUBSTRATE TEST PROBING EQUIPMENT HAVING FORCING PART FOR TEST HEAD AND FORCE-RECEIVING PATTERN FOR PROBE CARD AND METHODS OF USING THE SAME

(75) Inventors: Chang-Hyun Cho, Suwon-si (KR);
Joon-Yeon Kim, Seongnam-si (KR);
Sang-Gu Kang, Seoul (KR); Sung-Mo Kang, Suwon-si (KR); Sang-Kyu Yoo, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 135 days.

(21) Appl. No.: 12/098,778

(22) Filed: Apr. 7, 2008

(65) Prior Publication Data

US 2008/0252327 A1    Oct. 16, 2008

(30) Foreign Application Priority Data

Apr. 11, 2007    (KR) ...................... 10-2007-0035667

(51) Int. Cl.
*G01R 31/02* (2006.01)
(52) U.S. Cl. ...................................... 324/754; 324/758
(58) Field of Classification Search ........................ None
See application file for complete search history.

(56) References Cited

U.S. PATENT DOCUMENTS 5,489,853 A    2/1996    Nakajima

FOREIGN PATENT DOCUMENTS

| JP | 07-035777 | 2/1995 |
|---|---|---|
| JP | 2004-205487 | 7/2004 |
| KR | 1020030060221 A | 7/2003 |
| KR | 10-2006-0126439 | 12/2006 |

OTHER PUBLICATIONS

Decision of Grant issued Apr. 30, 2008 in corresponding Korean Patent application No. 2007-0035667.

*Primary Examiner*—Ha Tran T Nguyen
*Assistant Examiner*—Roberto Velez
(74) *Attorney, Agent, or Firm*—F. Chau & Associates, LLC

(57) ABSTRACT

Substrate test probing equipment having a force-receiving pattern for a probe card and a forcing part for a test head, and methods of using the same, in which with the force-receiving pattern for the probe card and the forcing part for the test head, thermal expansion and contraction of the probe card can be suppressed when the semiconductor substrate is being tested at high and low temperatures. To this end, to substrate test probing equipment having a substrate mover, a probe card, and a test head is prepared, in which the test head has a forcing part and the probe card has a force-receiving plate. A semiconductor substrate is placed on the substrate mover to be electrically connected with the probe card. The semiconductor substrate is electrically tested by the probe card and the test head. When the semiconductor substrate is being tested, the forcing part of the test head is brought into contact with the force-receiving pattern of the probe card.

26 Claims, 17 Drawing Sheets

SUBSTRATE TEST PROBING EQUIPMENT HAVING FORCING PART FOR TEST HEAD AND FORCE-RECEIVING PATTERN FOR PROBE CARD AND METHODS OF USING THE SAME

CROSS-REFERENCE TO RELATED APPLICATION

This application claims priority to Korean Application Serial No. 2007-0035667, filed Apr. 11, 2007, the disclosure of which is hereby incorporated herein by reference.

BACKGROUND OF THE INVENTION

1. Technical Field

The present disclosure relates to substrate test probing equipment and methods of using the same and, more particularly, to substrate test probing equipment having a force-receiving pattern for a probe card and a forcing part for a test head, and methods of using the same.

2. Discussion of Related Art

Typically, substrate test probing equipment has an information processor, a test head, a probe card, and a substrate mover. The substrate mover applies high-temperature and low-temperature heat to a semiconductor substrate and places the semiconductor substrate under the probe card. The probe card is located on the semiconductor substrate and is electrically connected with the semiconductor substrate. The test head is located on the probe card and is brought into contact with it. The information processor is electrically connected with the test head and the probe card for transmitting and receiving an electrical signal to and from the semiconductor substrate. Thus, the substrate test probing equipment may electrically test the semiconductor substrate at high and low temperatures.

In the substrate test probing equipment, however, when the semiconductor substrate is electrically tested, the probe card is thermally expanded and contracted due to radiant heat and conduction heat generated from the semiconductor substrate. This is because the probe card includes a lower surface having probe pins that are brought into contact with the semiconductor substrate, and an upper surface that is exposed to a different temperature than is the lower surface. That is, there may be a temperature differential between the lower surface and the upper surface of the probe card when the semiconductor substrate is electrically tested. The temperature differential between the lower surface and the upper surface may thermally expand and contract the probe card. Accordingly, the probe card gets bent in a specific direction from its initial shape and may not be brought into stable contact with the semiconductor substrate before the semiconductor substrate is electrically tested.

A test equipment having a similar structure to the above substrate test probing equipment is disclosed by Hisashi Nakajima in U.S. Pat. No. 5,489,853. According to Hisashi Nakajima, the test equipment comprises a stage, a probe card, a connection unit, and a test head that are stacked sequentially. The test head is brought into contact with the connection unit via a flexible wire. The connection unit is brought into contact with a neighboring engaging member and fixed to the test equipment. The connection unit is electrically connected with the probe card via a pogo pin, which is located adjacent the connection unit. The probe card has a probe. A semiconductor substrate may be placed on the stage. In this case, the probe of the probe card may be brought into contact with the semiconductor substrate.

In the test equipment, however, when heat is applied to the stage, the probe card is thermally expanded due to radiant heat generated from the semiconductor substrate. This is because a physical force for suppressing the thermal expansion is not applied from the connection unit to the probe card. The probe card is only electrically connected with the connection unit via the pogo pin. The connection unit is brought into contact with an engaging member of the test equipment and located between the probe card and the test head. Accordingly, when the semiconductor substrate is electrically tested causing heat to be applied to the stage, the probe card may be thermally expanded by the radiant heat from the semiconductor substrate, and the probe may be separated from the semiconductor substrate.

SUMMARY OF THE INVENTION

An exemplary embodiment of the present invention provides substrate test probing equipment having a force-receiving pattern located on a probe card and a forcing part for a test head brought into contact with the force-receiving pattern.

An exemplary embodiment of the present invention provides methods of using substrate test probing equipment having a force-receiving pattern for a probe card and a forcing part for a test head to suppress thermal expansion of the probe card when a semiconductor substrate is electrically tested at a high temperature.

Exemplary embodiments of the present invention provide substrate test probing equipment having a force-receiving pattern for a probe card and a forcing part for a test head, and methods of using the same.

The substrate test probing equipment comprises a substrate mover having an upper surface. A test head is disposed over the upper surface of the substrate mover. The test head has a forcing part and a resisting plate. The resisting plate is located over the substrate mover. The forcing part faces the substrate mover so as to be brought into contact with, and extend from, the resisting plate. A probe card is disposed between the test head and the substrate mover. The probe card includes a pin-supporting plate, a force-receiving plate, and a circuitry plate. The circuitry plate has upper and lower surfaces. The force-receiving plate has a force-receiving pattern in one of a concave or female shape and a convex or male shape over the upper surface of the circuitry plate, is fixed to the upper surface of the circuitry plate, and passes through the upper and lower surfaces of the circuitry plate. The pin-supporting plate is located on the lower surface of the circuitry plate, is surrounded by the force-receiving plate, and is electrically connected to the circuitry plate. An information processor is electrically connected with the probe card, the test head, and the substrate mover. The force-receiving plate corresponds to the resisting plate. The force-receiving pattern is brought into contact with the forcing part. The forcing part applies a physical force to the force-receiving pattern.

The method of using the substrate test probing equipment comprises preparing the substrate test probing equipment having a substrate mover, a test head, a probe card, and an information processor. The information processor is electrically connected with the test head, the substrate mover, and the probe card. The probe card is located between the test head and the substrate mover. The test head is located over the substrate mover. The test head is separated from the probe card to expose the probe card. The test head has a resisting plate located over the substrate mover. The test head further has a forcing part facing the substrate mover to be brought into contact with and extend from the resisting plate. The probe card is separated from the substrate test probing equipment to expose the substrate mover. The probe card includes a pin-supporting plate, a force-receiving plate, and a circuitry plate. The circuitry plate has upper and lower surfaces. The force-receiving plate has a force-receiving pattern in one of a concave or female shape and a convex or male shape over the upper surface of the circuitry plate, is fixed to the upper surface of the circuitry plate, and passes through the upper and lower surfaces of the circuitry plate. The pin-supporting plate is located on the lower surface of the circuitry plate, is surrounded by the force-receiving plate, and is electrically connected to the circuitry plate. A semiconductor substrate is safely placed on the substrate mover. The probe card and the test head are sequentially stacked on the test probing equipment so that the probe card and the test head are located on, and electrically connected with, the semiconductor substrate. The forcing part of the test head is brought into contact with the force-receiving pattern of the probe card to apply a physical force to the force-receiving pattern of the probe card. The semiconductor substrate is electrically tested through the information processor.

The present invention will now be described more fully hereinafter with reference to the accompanying drawings, in which exemplary embodiments of the present invention are shown. The present invention may, however, be embodied in many different forms and should not be construed as being limited to the exemplary embodiments set forth herein. Rather, these exemplary embodiments are provided so that this disclosure will be thorough and complete, and will fully convey the scope of the invention to those of ordinary skill in the art.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
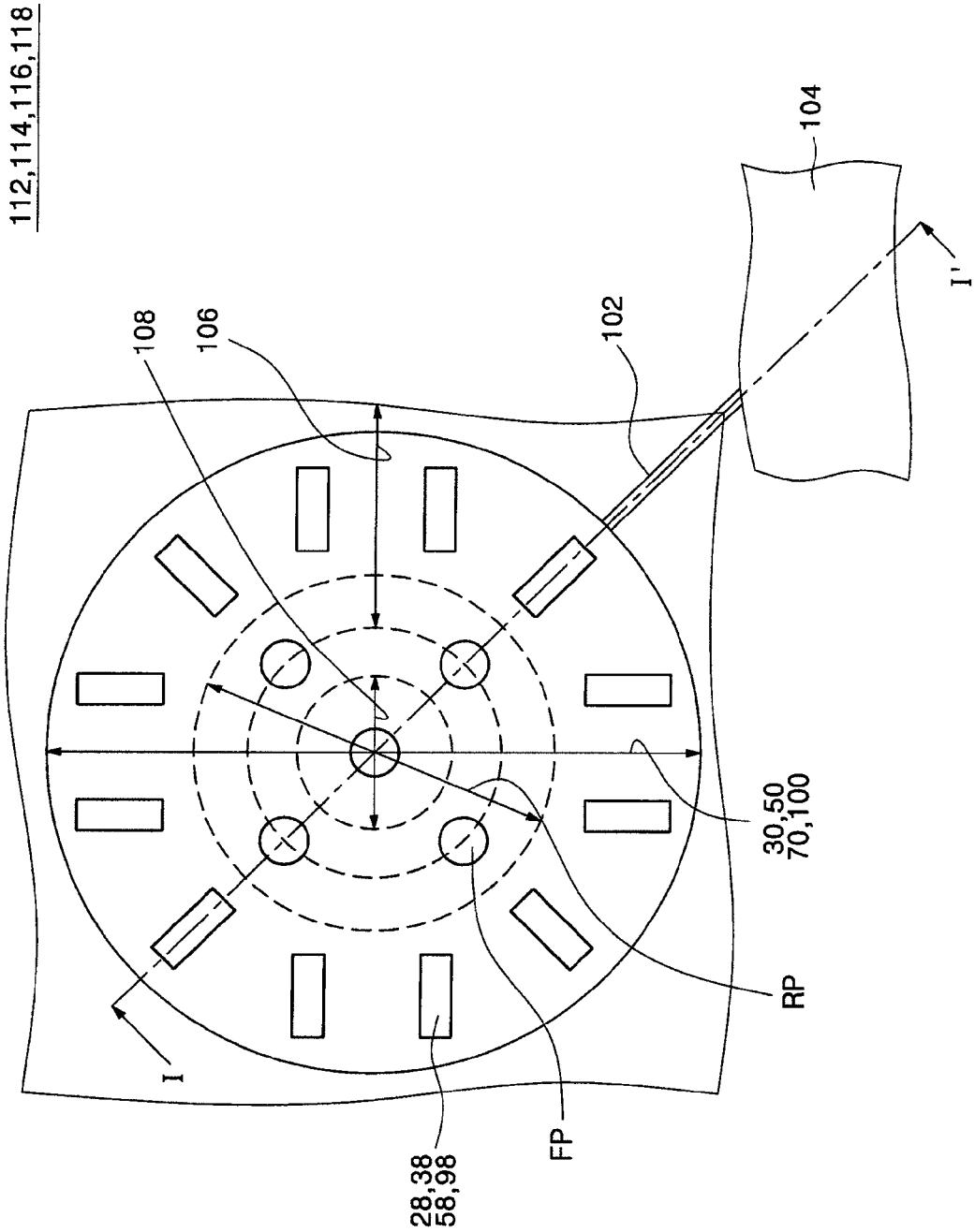
FIG. 1 is a plan view showing a substrate testing equipment according to an exemplary embodiment of the present invention.

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided as teaching examples of the invention. Like numbers refer to like elements in the drawings.

FIG. 1 is a plan view showing a substrate testing equipment according to an exemplary embodiment of the present invention, and FIGS. 2 to 5 are cross-sectional views showing a substrate testing equipment taken along line I-I' of FIG. 1.

Figure 2:
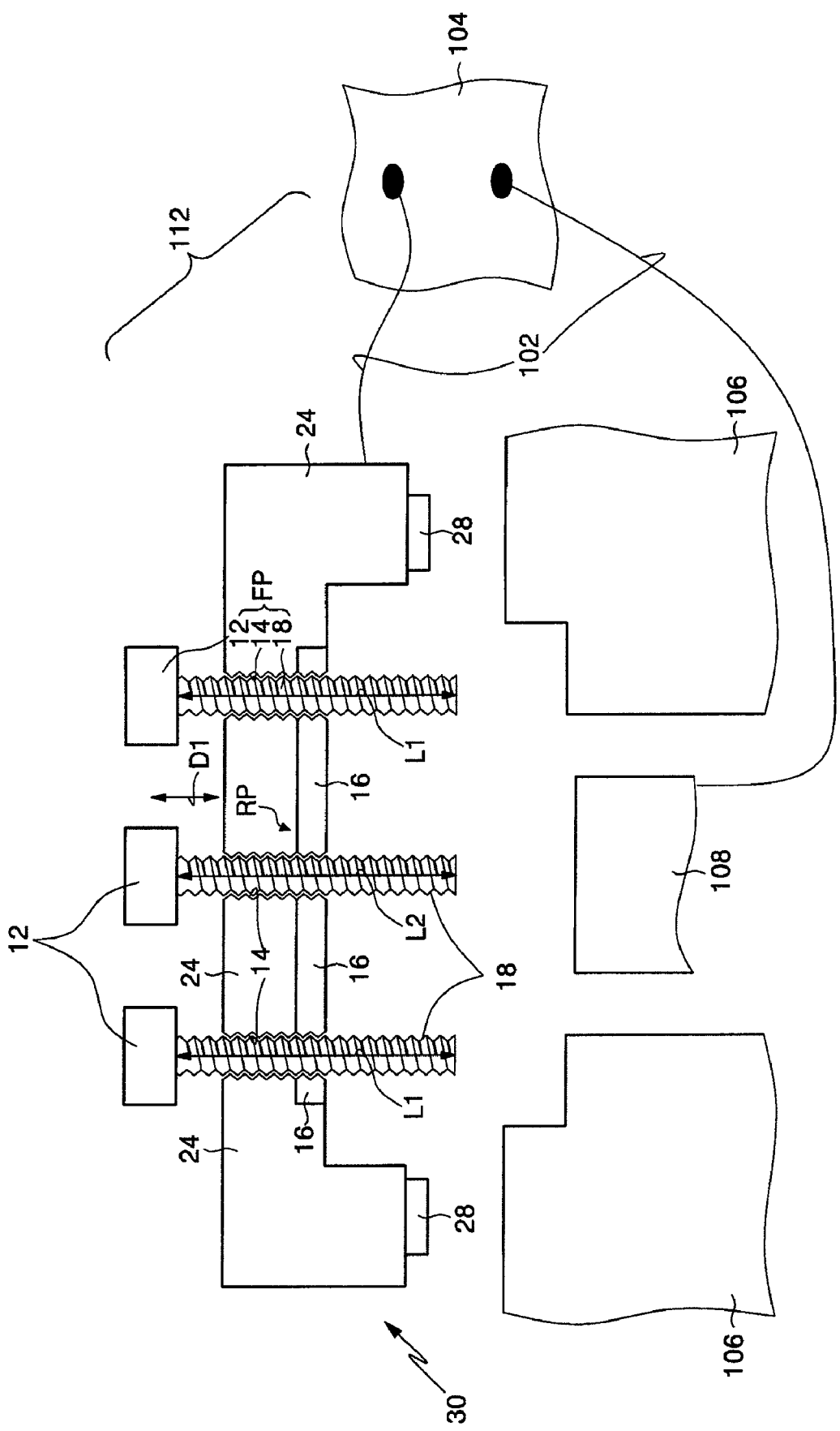
FIGS. 2 to 5 are cross-sectional views showing a substrate testing equipment taken along line I-I' of FIG. 1 according to an exemplary embodiment of the present invention.

Referring to FIGS. 1 and 2, the substrate testing equipment 112 according to exemplary embodiments of the present invention includes a substrate mover 108 and a test head 30 that are stacked sequentially as shown in FIGS. 1 and 2. A semiconductor substrate may be safely placed on the substrate mover 108. The test head 30 has a head body 24, a resisting plate RP, and forcing parts FP as shown in FIG. 2. The forcing parts FP can be brought into contact with the resisting plate RP, extend from the resisting plate RP, and are located in the central area and the peripheral area of the substrate mover 108, as shown in FIG. 1 or 2. Each of the forcing parts FP may include a clamp driver 12, an induction hole 14, and a clamp 18 as shown in FIG. 2. The clamps 18 may move up and down along a displacement vector D1 in the resisting plate RP and the head body 24 through the induction holes 14. The clamps 18 may all have the same length L1.

When the clamps 18 have the same length L1, the clamp 18 at the central area of the resisting plate RP may have a different width from the clamps 18 in the peripheral area of the resisting plate RP. Alternatively, the clamp 18 at the central area of the resisting plate RP may have the same width as the clamps 18 in the peripheral area of the resisting plate RP. On the other hand, the clamp 18 at the central area of the resisting plate RP may have a predetermined length L2, and the clamps 18 in the peripheral area of the resisting plate RP may have a length L1 different from the length L2 of the clamp 18 in the central area of the resisting plate RP. To this end, the clamp 18 at the central area of the resisting plate RP may have the same width as the clamps 18 in the peripheral area of the resisting plate RP. Alternatively, the clamp 18 at the central area of the resisting plate RP may have a different width from the clamps 18 in the peripheral area of the resisting plate RP. The clamp 18 may have a thread formed on a surface thereof. Alternatively, the clamp 18 may have various shapes other than the thread formed on the surface.

Referring back to FIGS. 1 and 2, the induction holes 14 may pass through the resisting plate RP and the head body 24 as shown in FIG. 2. The induction holes 14 may have a thread formed on the sidewalls thereof to engage with the threads on the clamps 18. Alternatively, the induction holes 14 may have different shapes from the thread formed on the sidewalls thereof to engage with the clamps 18. The clamp drivers 12 may be used to apply a physical force to the clamps 18. The resisting plate RP may be located in and fixed to the head body 24 as shown in FIGS. 1 and 2 in the form of a clamp guide 16 for allowing the clamps 18 to move up and down. The clamp guide 16 may be electrically connected with at least one of the substrate mover 108 and the head body 24 and with the clamp driver 12. The substrate testing equipment 112 further includes an information processor 104 and a probe station 106, as shown in FIGS. 1 and 2. The probe station 106 may surround the substrate mover 108, as shown in FIGS. 1 and 2. A probe card (not shown) may be safely placed on the probe station 106. Alternatively, the probe station 106 may be formed in a different shape from that shown in FIG. 2.

The information processor 104 may be electrically connected with the head body 24 and the substrate mover 108 via connection lines 102 as shown in FIGS. 1 and 2. Alternatively, the information processor 104 may be electrically connected with the test head 24, the probe station 106, and the substrate mover 108 via the connection lines 102. An optical camera (not shown) may be provided to the substrate mover 108. Alternatively, the optical camera may be provided to one of the components other than the substrate mover 108. The optical camera may be electrically connected to at least one of the substrate mover 108 and the head body 24. The head body 24 may have head connectors 28 as shown in FIGS. 1 and 2. The head connectors 28 may be disposed in a peripheral area of the head body 24 so as to face the probe station 106. A cooling fan (not shown) may be disposed between the head body 24 and the probe station 106. The cooling fan may be electrically connected to the information processor 104.

Figure 3:
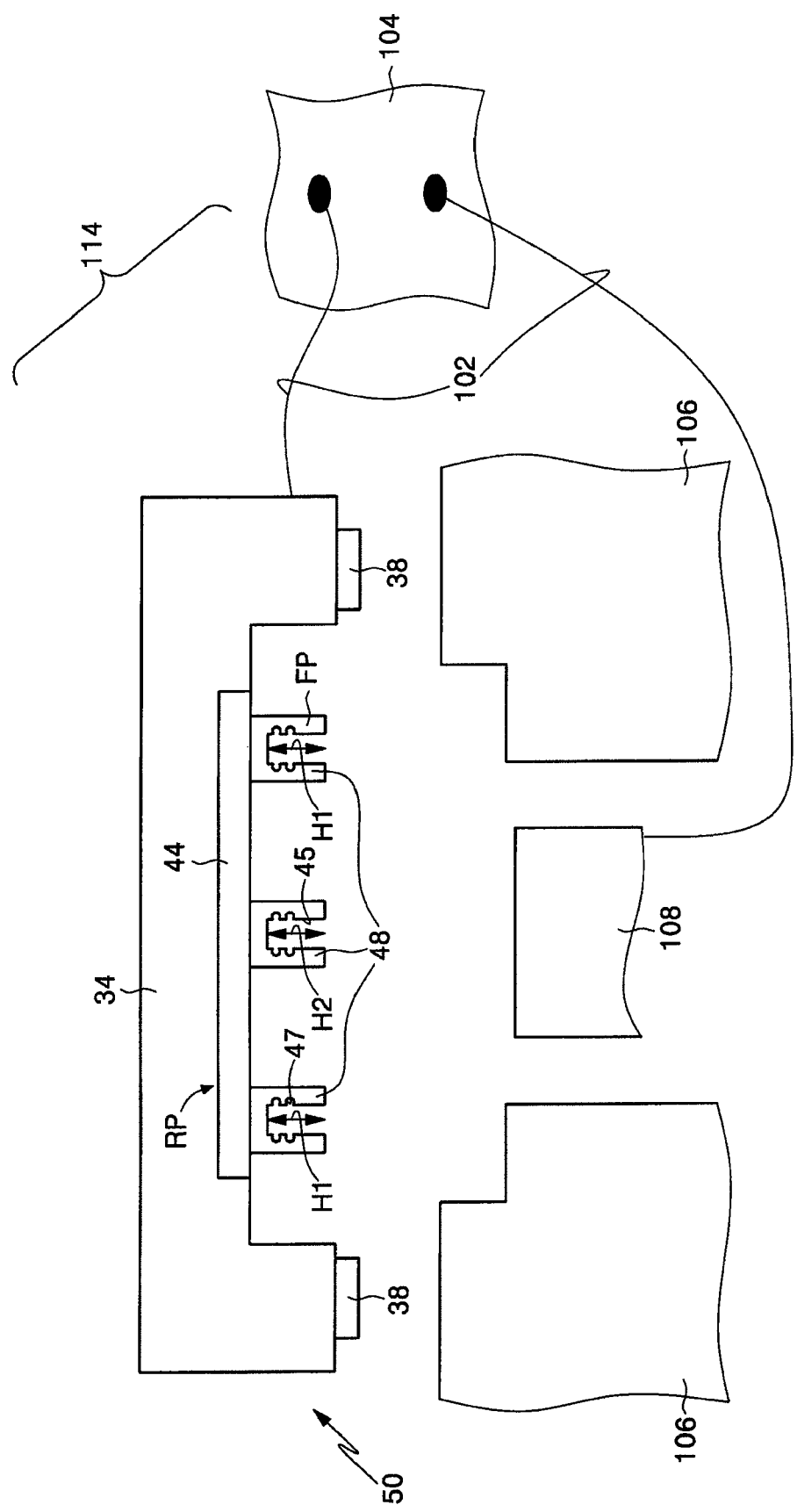

Referring to FIGS. 1 and 3, a substrate testing equipment 114 according to an exemplary embodiment of the present invention includes a substrate mover 108 and a test head 50 that are stacked sequentially, as shown in FIGS. 1 and 3. A semiconductor substrate may be safely placed on the substrate mover 108. The test head 50 has a head body 34, a resisting plate RP, and forcing parts FP, as shown in FIG. 3. The forcing parts FP may be brought into contact with the resisting plate RP, extend from the resisting plate RP, and are located in a central area and a peripheral area of the substrate mover 108, as shown in FIG. 1 or 3. The forcing parts FP are located beneath the resisting plate RP and are brought into contact with the resisting plate RP. Each of the forcing parts FP is formed of a resisting clamp 48 having concave parts 45 and clamp pits 47 formed on the sidewalls of the concave parts 45 as shown in FIG. 3. Each of the resisting clamps 48 may have two or more clamp pits 47 formed on one sidewall of the concave part 45. Alternatively, the resisting clamp 48 may have different shapes from the thread formed on the sidewall of the concave part 45.

The concave parts 45 may be formed in the resisting clamps 48 to have a same height H1 in a central area and a peripheral area of the resisting plate RP. When the concave parts 45 have the same height H1, the resisting clamp 48 at the central area of the resisting plate RP may have a different width from the resisting clamps 48 in the peripheral area of the resisting plate RP. Alternatively, the resisting clamp 48 at the central area of the resisting plate RP may have the same width as the resisting clamps 48 in the peripheral area of the resisting plate RP. On the other hand, the resisting clamp 48 at the central area of the resisting plate RP may have a predetermined height H2, and the resisting clamps 48 in the peripheral area of the resisting plate 48 may have a height H1 different from the height H2 of the resisting clamp 48 at the central area of the resisting plate RP. To this end, the resisting clamp 48 at the central area of the resisting plate RP may have the same width as the resisting clamps 48 in the peripheral area of the resisting plate RP. Alternatively, the resisting clamp 48 at the central area of the resisting plate RP may have a different width from the resisting clamps 48 in the peripheral area of the resisting plate RP.

Referring back to FIGS. 1 and 3, the resisting plate RP can be fixed into the head body 34 and serve as a displacement-resisting plate 44, as shown in FIG. 3. The displacement-resisting plate 44 may be electrically connected with at least one of the to substrate mover 108 and the head body 34 and can apply a physical force to the resisting clamps 48. The substrate testing equipment 114 further includes the information processor 104 and the probe station 106, as shown in FIGS. 1 and 3. The probe station 106 may surround the substrate mover 108, as shown in FIGS. 1 and 3. A probe card(not shown) may be safely placed on the probe station 106. Alternatively, is the probe station 106 may be formed in a different shape from that shown in FIG. 3.

The information processor 104 may be electrically connected with the head body 34 and the substrate mover 108 via connection lines 102, as shown in FIGS. 1 and 3. Alternatively, the information processor 104 may be electrically connected with the head body 34, the probe station 106, and the substrate mover 108 via the connection lines 102. An optical camera (not shown) may be provided to the substrate mover 108. Alternatively, the optical camera may be provided to one of the components other than the substrate mover 108. The optical camera may be electrically connected to at least one of the substrate mover 108 and the head body 34. The head body 34 may have head connectors 38, as shown in FIG. 1 or 3. The head connectors 38 may be disposed in a peripheral area of the head body 34 so as to face the probe station 106. A cooling fan (not shown) may be disposed between the head body 34 and the probe station 106. The cooling fan may be electrically connected to the information processor 104.

Figure 4:
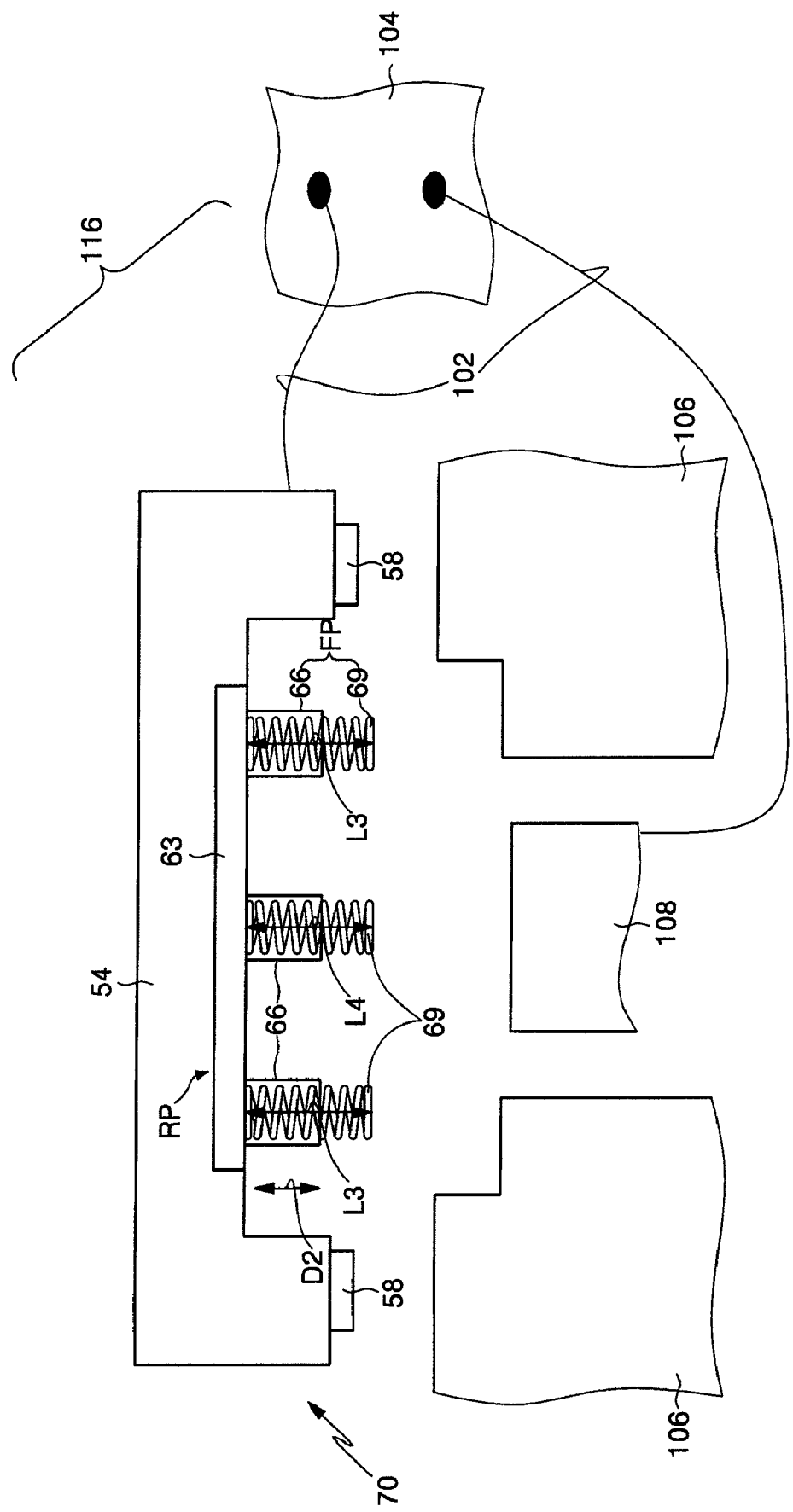

Referring to FIGS. 1 and 4, a substrate testing equipment 116 according to an exemplary embodiment of the present invention includes a substrate mover 108 and a test head 70 that are stacked sequentially, as shown in FIGS. 1 and 4. A semiconductor substrate may be safely placed on the substrate mover 108. The test head 70 has a head body 54, a resisting plate RP, and forcing parts FP, as shown in FIG. 4. The forcing parts FP can be brought into contact with the resisting plate RP, extend from the resisting plate RP, and are located in a central area and a peripheral area of the substrate mover 108, as shown in FIG. 1 or 4. To this end, the forcing parts FP are located beneath the resisting plate RP and respectively have induction cylinders 66 and transformable elastic bodies 69 that are brought into contact with the resisting plate as shown in FIG. 4. The transformable elastic bodies 69 are respectively located inside the induction cylinders 66 and protrude from the induction cylinders 66. The transformable elastic bodies 69 move up and down along the displacement vector D2 inside the induction cylinders 66. The transformable elastic bodies 69 may be springs. Alternatively, the transformable elastic bodies 69 may be formed of other elastic materials.

The transformable elastic bodies 69 may have a same length L3 in a central area and a peripheral area of the resisting plate RP. When the transformable elastic bodies 69 have a same length L3, the transformable elastic body 69 at the central area of the resisting plate RP may have a different width from that of the transformable elastic bodies 69 in the peripheral area of the resisting plate RP. Alternatively, the transformable elastic body 69 at the central area of the resisting plate RP may have the same width as the transformable elastic bodies 69 in the peripheral area of the resisting plate RP. On the other hand, the transformable elastic body 69 at the central area of the resisting plate RP may have a predetermined length L4 and the transformable elastic bodies 69 in the peripheral area of the resisting plate RP may have a length L3 different from the length L4 of the transformable elastic body 69 at the central area of the resisting plate RP. To this end, the transformable elastic body 69 at the central area of the resisting plate RP may have the same width as the transformable elastic bodies 69 in the peripheral area of the resisting plate RP. Alternatively, the transformable elastic body 69 at the central area of the resisting plate RP may have a different width from those of the transformable elastic bodies 69 in the peripheral area of the resisting plate RP.

Referring back to FIGS. 1 and 4, the resisting plate RP may be fixed into the head body 54 and serve as an elasticity resisting plate 63, as shown in FIG. 4. The elasticity resisting plate 63 may be electrically connected to at least one of the substrate mover 108 and the head body 54. The elasticity resisting plate 63 may apply a physical force to the transformable elastic bodies 69. The substrate testing equipment 116 further includes the information processor 104 and the probe station 106, as shown in FIGS. 1 and 4. The probe station 106 may surround the substrate mover 108, as shown in FIGS. 1 and 4. A probe card may be safely placed on the probe station 106. Alternatively, the probe station 106 may be formed in a different shape from that shown in FIG. 4.

The information processor 104 may be electrically connected with the head body 54 and the substrate mover 108 via connection lines 102 as shown in FIGS. 1 and 4. Alternatively, the information processor 104 may be electrically connected with the test head 54, the probe station 106, and the substrate mover 108 via the connection lines 102. An optical camera (not shown) may be provided to the substrate mover 108. Alternatively, the optical camera may be provided to one of the components other than the substrate mover 108. The optical camera may be electrically connected to at least one of the substrate mover 108 and the head body 54. The optical camera may check the displacement amount of the transformable elastic bodies 69 and provide the results of the checking, that is, image information, to the information processor 104.

The information processor 104 may analyze the image information and provide the displacement amount of the transformable elastic bodies 69 to the elasticity resisting plate 63 via the head body 54. The elasticity resisting plate 63 may apply a physical force to the transformable elastic bodies 69 by the displacement amount of the elastic bodies 69. The head body 54 may have head connectors 58, as shown in FIG. 1 or 4. The head connectors 58 may be disposed in a peripheral area of the head body 54 to face the probe station 106. A cooling fan (not shown) may be disposed between the head body 54 and the probe station 106. The cooling fan may be electrically connected to the information processor 104.

Figure 5:
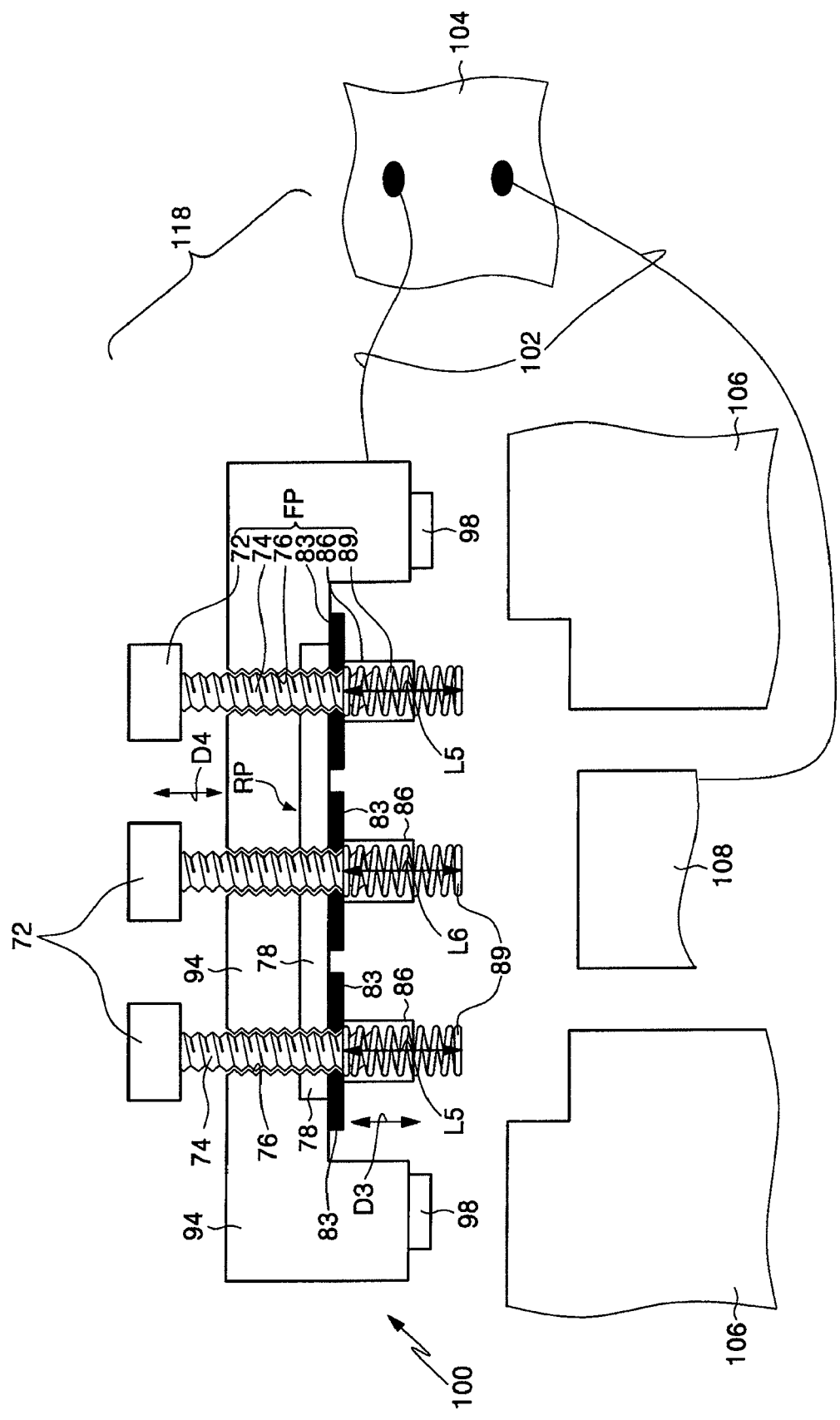

Referring to FIGS. 1 and 5, a substrate testing equipment 118 according to an exemplary embodiment of the present invention includes a substrate mover 108 and a test head 100 that are stacked sequentially as shown in FIGS. 1 and 5. A semiconductor substrate may be safely placed on the substrate mover 108. The test head 100 has a head body 94, a resisting plate RP, and forcing parts FP as shown in FIG. 5. The forcing parts FP can be brought into contact with the resisting plate RP, extend from the resisting plate RP, and are located in a central area and a peripheral area of the substrate mover 108, as shown in FIG. 1 or 5. The forcing parts FP may respectively include displacement drivers 72, displacement adjustors 74, displacement adjusting holes 76, displacement sensors 83, protection cylinders 86, and displacement elastic bodies 89, as shown in FIG. 5. The displacement elastic bodies 89, the protection cylinders 86, and the displacement sensors 83 are located beneath the resisting plate RP. The displacement elastic body 89 is located inside the protection cylinder 86 and protrudes from the protection cylinder 86. The displacement elastic bodies 89 may move up and down along a displacement vector D3 inside the protection cylinders 86.

The displacement elastic bodies 89 may be springs. Alternatively, the displacement elastic bodies 89 may be formed of other elastic materials. The displacement elastic bodies 89 may have a same length L5 in the central area and the peripheral area of the resisting plate RP. When the displacement elastic bodies 89 have a same length L5, the displacement elastic body 89 at the central area of the resisting plate RP may have a different width from those of the displacement elastic bodies 89 in the peripheral area of the resisting plate RP. Alternatively, the displacement elastic body 89 at the central area of the resisting plate RP may have the same width as the displacement elastic bodies 89 in the peripheral area of the resisting plate RP. On the other hand, the displacement elastic body 89 at the central area of the resisting plate RP has a predetermined length L6 and the displacement elastic bodies 89 in the peripheral area of the resisting plate RP may have a length L5 different from the displacement elastic body 89 at the central area of the resisting plate RP. To this end, the displacement elastic body 89 at the central area of the resisting plate RP may have the same width as the displacement elastic bodies 89 in the peripheral area of the resisting plate RP. Alternatively, the displacement elastic body 89 at the central area of the resisting plate RP may have a different width from the displacement elastic bodies 89 in the peripheral area of the resisting plate RP.

Referring back to FIGS. 1 and 5, the displacement sensors 83 are electrically connected with the displacement elastic bodies 89 as shown in FIG. 5. The displacement sensors 83 may convert the elastic force of the displacement elastic bodies 89 into an electrical signal. The displacement adjusting holes 76 pass through the displacement sensors 83, the resisting plate RP, and the head body 94, as shown in FIG. 5. The displacement adjusting holes 76 may have a thread formed on the sidewalls thereof. The displacement adjusting holes 76 may have different shapes from the thread formed on the sidewalls thereof. The displacement adjustors 74 may move up and down along a displacement vector D4 in the displacement sensors 83, the resisting plate RP, and the head body 94 through the displacement adjusting holes 76. The displacement adjustors 74 may move up and down to move the displacement elastic bodies 89 as shown in FIG. 5. The displacement adjustors 74 may pass through the resisting plate RP and the head body 94 to be spaced apart from the displacement elastic bodies 89 together with the displacement adjusting holes 76.

The displacement adjustors 74 may have a thread formed on the sidewalls thereof to engage with the displacement adjusting holes 76, as shown in FIG. 5. Alternatively, the displacement adjustors 74 may have different shapes from the thread formed on the sidewalls thereof to engage with the displacement adjusting holes 76. Accordingly, the displacement adjustors 74 may have the same structure in the central area and the peripheral area of the resisting plate RP as the clamps 18 of FIG. 2. The resisting plate RP may be fixed into the head body 94 and electrically connected with at least one of the substrate mover 108 and the head body 94 and with the displacement sensor 83, and may serve as a displacement controller 78. The displacement controller 78 may be electrically connected with the displacement driver 72. The displacement controller 78 may calculate the displacement amount of the displacement elastic bodies 89 through the displacement sensors 83. The displacement drivers 72 may apply a physical force to the displacement adjustor 74 by the displacement amount of the displacement elastic bodies 89 through the displacement controller 78.

Again referring back to FIGS. 1 and 5, the substrate testing equipment 118 further includes the information processor 104 and the probe station 106, as shown in FIG. 5. The probe station 106 may surround the substrate mover 108, as shown in FIGS. 1 and 5. A probe card (not shown) may be safely placed on the probe station 106. Alternatively, the probe station 106 may be formed in a different shape from that shown in FIG. 5. The information processor 104 may be electrically connected with the head body 94 and the substrate mover 108 via connection lines 102. Alternatively, the information processor 104 may be electrically connected with the head body 94, the probe station 106, and the substrate mover 108 via the connection lines 102. An optical camera (not shown) may be provided to the substrate mover 108. Alternatively, the optical camera may be provided to one of the components other than the substrate mover 108. The optical camera may be electrically connected to at least one of the substrate mover 108 and the head body 94.

The optical camera may serve as displacement sensors 83. Specifically, the optical camera may check the displacement amount of the displacement elastic bodies 89 and provide the results of the checking, that is, image information, to the information processor 104. The information processor 104 can analyze the image information and provide the displacement amount of the displacement elastic bodies 89 to the displacement drivers 72 via the head body 94. The displacement drivers 72 can apply a physical force to the displacement elastic bodies 89 based on the determined displacement amount of the displacement elastic bodies 89. The head body 94 may have head connectors 98 as shown in FIG. 1 or 5. The head connectors 98 may be disposed in a peripheral area of the head body 94 to face the probe station 106. A is cooling fan (not shown) may be disposed between the head body 94 and the probe station 106. The cooling fan may be electrically connected to the information processor 104.

Figure 6:
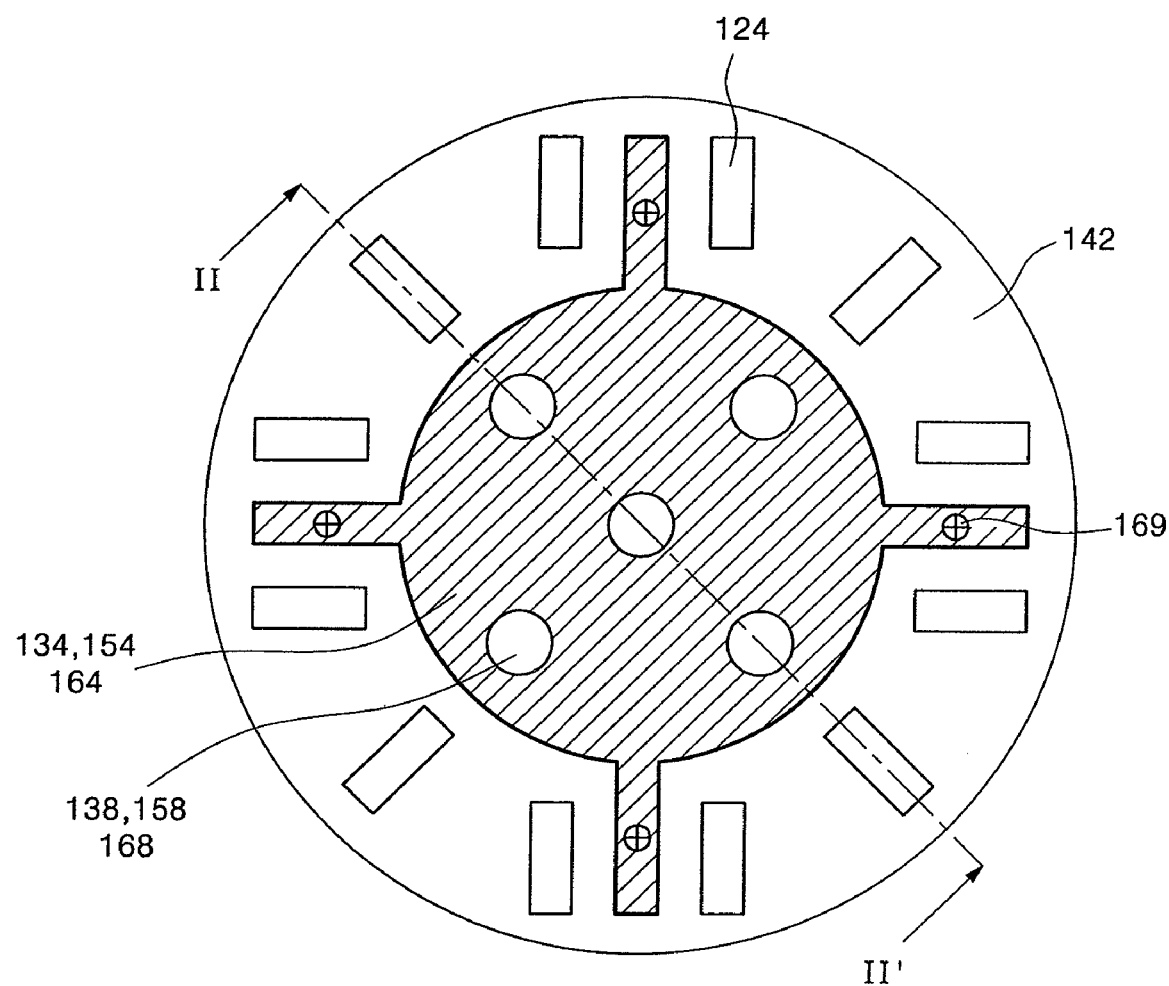
FIGS. 6 and 7 are plan views showing lower and upper surfaces of a probe card according to an exemplary embodiment of the present invention.
Figure 7:
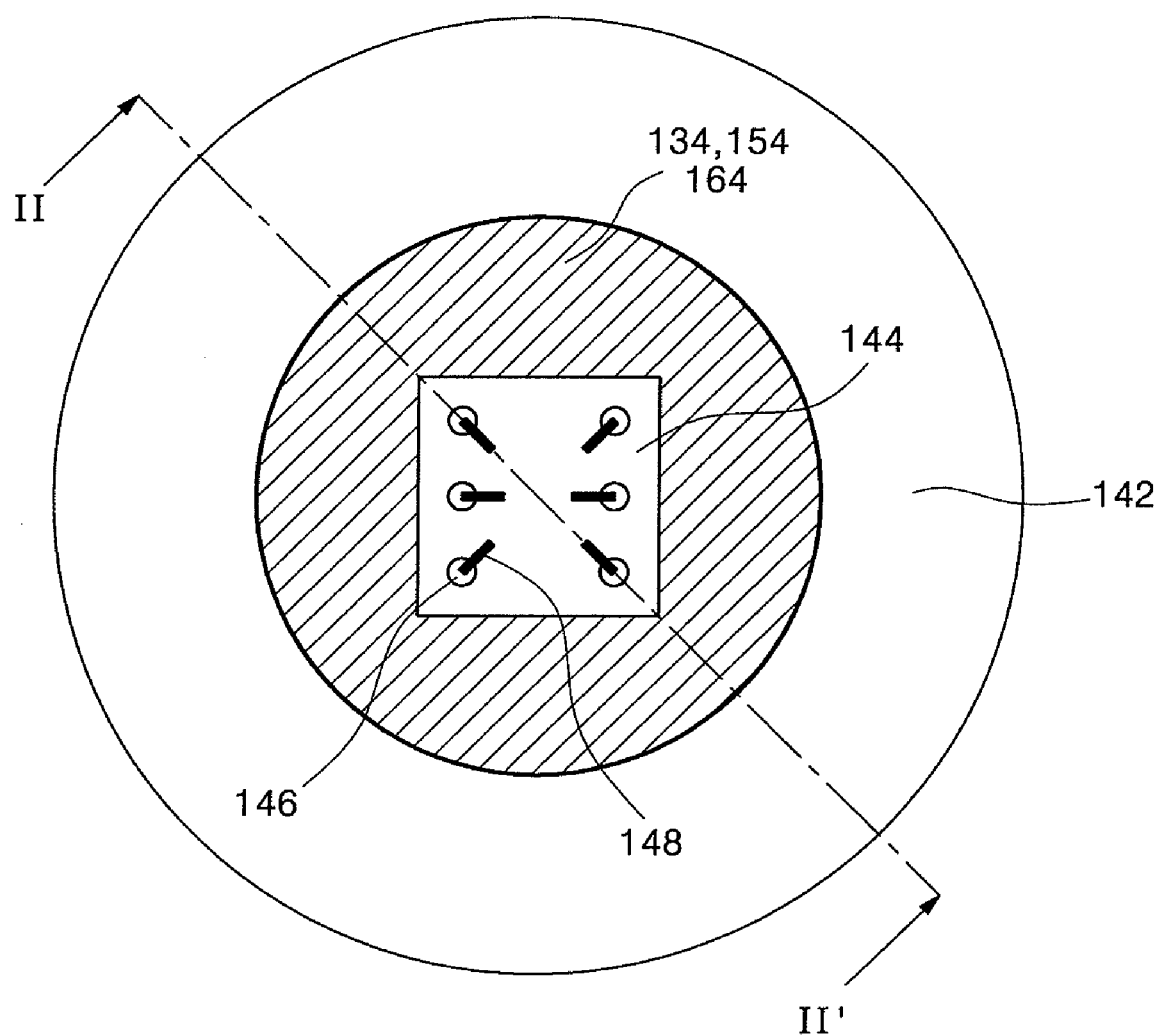
Figure 8:
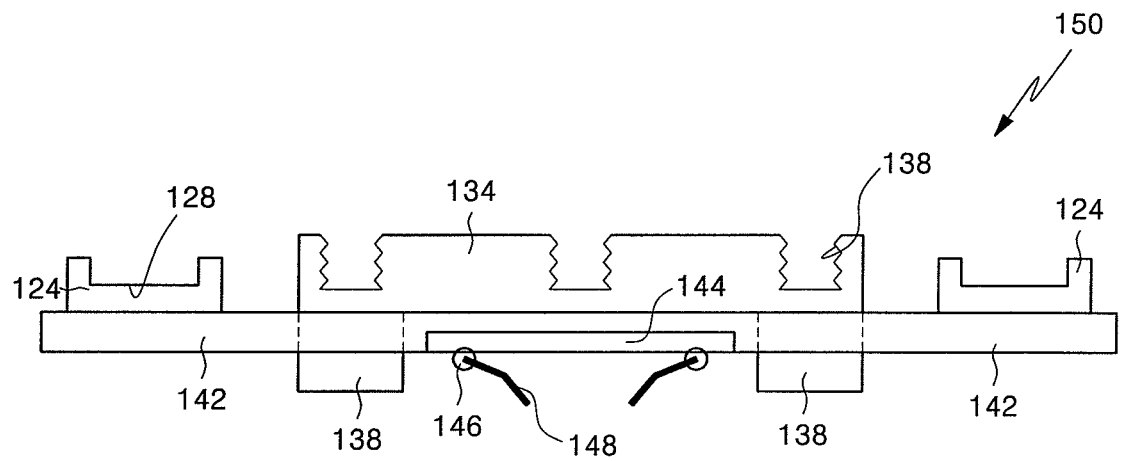
FIGS. 8 to 10 are cross-sectional views showing a probe card taken along line II-II' of FIGS. 6 and 7 according to an exemplary embodiment of the present invention.
Figure 9:
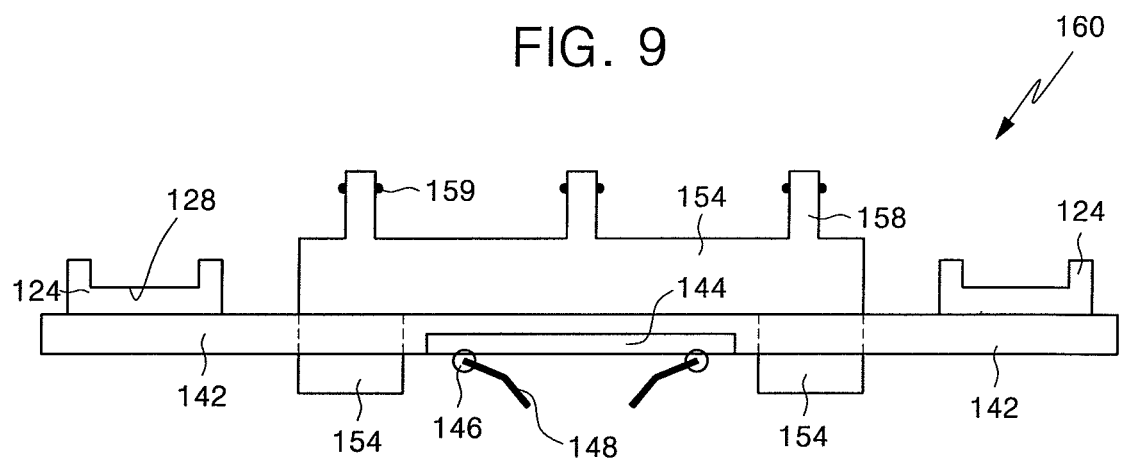
Figure 10:
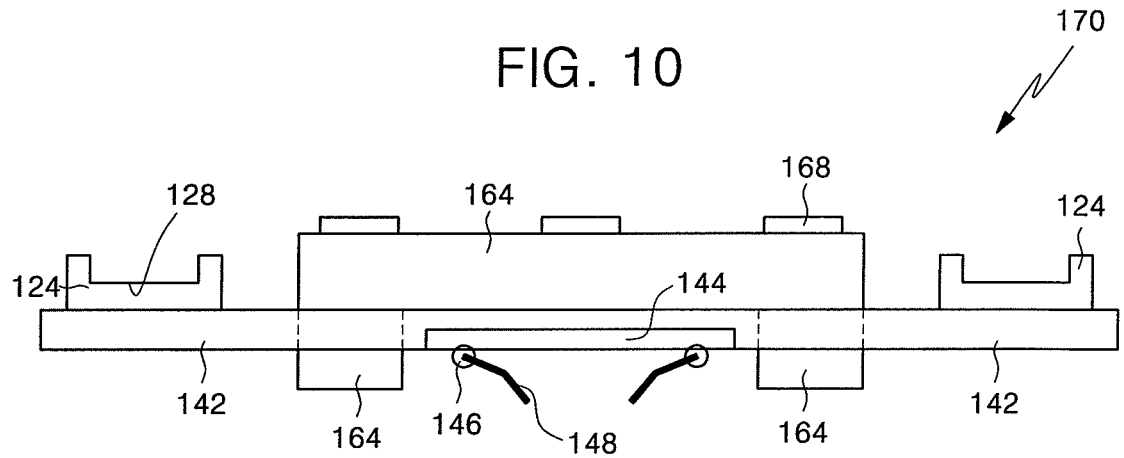

FIGS. 6 and 7 are plan views showing lower and upper surfaces of a probe card according to an exemplary embodiment of the present invention, and FIGS. 8 to 10 are cross-sectional views showing a probe card taken along line II-II' of FIGS. 6 and 7 according to an exemplary embodiment of the present invention.

Referring to FIGS. 6, 7 and 8, a probe card 150 according to an exemplary embodiment of the present invention includes a force-receiving plate 134 and a circuitry plate 142, as shown in FIG. 6, 7 or 8. The circuitry plate 142 may have an upper surface and a lower surface. The circuitry plate 142 may have semiconductor discrete devices (not shown) and interconnections for electrically connecting the semiconductor discrete devices. The circuitry plate 142 may have probe connectors 124 on the upper surface, as shown in FIG. 6 or 8. The probe connectors 124 may have grooves 128. The probe connectors 124 may be brought into contact with the head connectors 28 of FIG. 2 through the grooves 128. The force-receiving plate 134 is fixed to the upper surface of the circuitry plate 142 and passes through the upper surface and the lower surface of the circuitry plate 142.

The force-receiving plate 134 may include a surface having concave (female) and convex (male) shapes to extend in parallel with the upper surface of the circuitry plate 142. The force-receiving plate 134 may have force-receiving patterns 138 as the concave (female) shapes and the convex (male) shapes that form the surface of the force-receiving plate 134. The force-receiving patterns 138 may be respectively brought into contact with the clamps 18 shown in FIG. 2. The probe card 150 further includes a pin-supporting plate 144, as shown in FIGS. 7 and 8. The pin-supporting plate 144 may be located on the lower surface of the circuitry plate 142, surrounded by the force-receiving plate 134, and electrically connected to the circuitry plate 142. The pin-supporting plate 144 may have probe pins 148. The probe pins 148 may be fixed to the pin-supporting plate 144 by a connection material 146. The probe pins 148 may be located on the substrate mover 108 of FIG. 1. To this end, the probe card 150 may be located between the substrate mover 108 and the test head 30 shown in FIG. 2.

Referring to FIGS. 6, 7 and 9, a probe card 160 according to an exemplary embodiment of the present invention includes a force-receiving plate 154 and a circuitry plate 142, as shown in FIG. 6, 7, or 9. The circuitry plate 142 may have an upper surface and a lower surface. The circuitry plate 142 may have discrete semiconductor devices (not shown) and interconnections for electrically connecting the semiconductor discrete devices. The circuitry plate 142 may have probe connectors 124 on the upper surface, as shown in FIG. 6 or 9. The probe connectors 124 may have grooves 128. The probe connectors 124 may be respectively brought into contact with the head connectors 38 of FIG. 3 through the grooves 128. The force-receiving plate 154 is fixed to the upper surface of the circuitry plate 142 and passes through the upper surface and the lower surface of the circuitry plate 142. The force-receiving plate 154 may have a surface in concave (female) and convex (male) shapes to extend in parallel with the upper surface of the circuitry plate 142.

The force-receiving plate 154 may have force-receiving patterns 158 as the concave (female) and convex (male) shapes that form the surface of the force-receiving plate 154, as shown in FIGS. 6 and 9. The force-receiving patterns 158 may be respectively brought into contact with the resisting clamps 48 shown in FIG. 3. The force-receiving pattern 158 has engagers 159 formed on the sidewalls thereof. The engagers 159 of the force-receiving patterns 158 may respectively correspond to the clamp pits 47 of the resisting clamps 48 shown in FIG. 3. The probe card 160 further includes a pin-supporting plate 144 as shown in FIGS. 7 and 9. The pin-supporting plate 144 may be located on the lower surface of the circuitry plate 142, surrounded by the force-receiving plate 154, and electrically connected to the circuitry plate 142. The pin-supporting plate 144 may have probe pins 148. The probe pins 148 may be fixed to the pin-supporting plate 144 by a connection material 146. The probe pins 148 may be located on the substrate mover 108 of FIG. 1. To this end, the probe card 160 may be located between the substrate mover 108 and the test head 50 of FIG. 3.

Referring to FIGS. 6, 7 and 10, a probe card 170 according to an exemplary embodiment of the present invention includes a force-receiving plate 164 and a circuitry plate 142, as shown in FIG. 6, 7, or 10. The circuitry plate 142 may have an upper surface and a lower surface. The circuitry plate 142 may have semiconductor discrete devices and interconnections for electrically connecting the semiconductor discrete devices. The circuitry plate 142 may have probe connectors 124 on the upper surface, as shown in FIG. 6 or 10. The probe connectors 124 may have grooves 128. The probe connectors 124 may be respectively brought into contact with the head connectors 58 of FIG. 4 or 98 of or FIG. 5 through the grooves 128. The force-receiving plate 164 is fixed to the upper surface of the circuitry plate 142 and passes through the upper surface and the lower surface of the circuitry plate 142.

The force-receiving plate 164 may have a surface in parallel with the upper surface of the circuitry plate. The force-receiving plate 164 may have force-receiving patterns 168 located on the surface of the force-receiving plate 164. The force-receiving patterns 168 may be respectively brought into contact with the transformable elastic bodies 69 shown in FIG. 4 or the displacement elastic bodies 89 shown in FIG. 5. The probe card 170 further includes a pin-supporting plate 144, as shown in FIGS. 7 and 10. The pin-supporting plate 144 may be located on the lower surface of the circuitry plate 142, surrounded by the force-receiving plate 164, and electrically connected to the circuitry plate 142. The pin-supporting plate 144 may have probe pins 148. The probe pins 148 may be fixed to the pin-supporting plate 144 by a connection material 146. The probe pins 148 may be located on the substrate mover 108 of FIG. 1. To this end, the probe card 170 may be located between the substrate mover 108 and the test head 70 of FIG. 4 or between the substrate mover 108 and the test head 100 of FIG. 5.

FIGS. 11 to 14 are cross-sectional views showing a substrate test probing equipment taken along line I-I' of FIG. 1 and along line II-II' of FIGS. 6 and 7 according to exemplary embodiments of the present invention.

Figure 11:
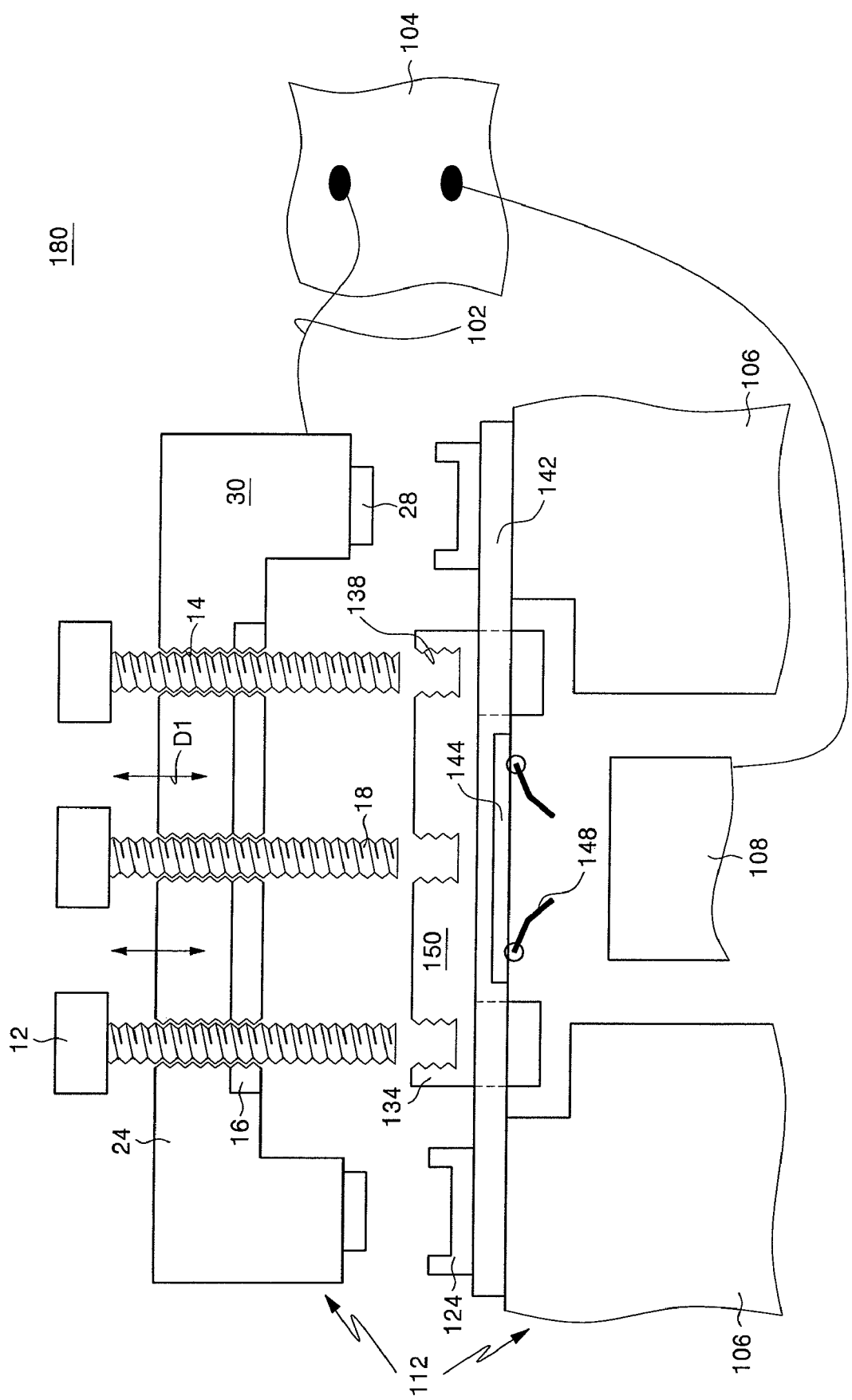
FIGS. 11 to 14 are cross-sectional views showing a substrate test probing equipment taken along line I-I' of FIG. 1 and the line II-II' of FIGS. 6 and 7 according to an exemplary embodiment of the present invention.

Referring to FIGS. 1, 6, 7, and 11, a substrate test probing equipment 180 according to an exemplary embodiment of the present invention includes the substrate testing equipment 112 of FIG. 2 and the probe card 150 of FIG. 8 as shown in FIG. 11. The probe card 150 may be disposed between the probe station 106 and the test head 30. The probe card 150 may have the force-receiving plate 134 and the pin-supporting plate 144 at the central area of the probe card 150. The pin-supporting plate 144 may be located on the lower surface of the probe card 142 and have the probe pins 148. The probe pins 148 may be directed downwardly toward the substrate mover 108. The force-receiving plate 134 passes through the upper surface and the lower surface of the probe card 142 and has the force-receiving patterns 138 over the upper surface of the probe card 142. The probe card 150 has the probe connectors 124 in the peripheral area of the probe card 150. The probe card 150 may have fixing members (not shown) that are brought into contact with the probe station 106 so as to prevent the probe station 106 from moving when the semiconductor substrate is electrically tested.

The test head 30 may have the head body 24. The head body 24 has the clamps 18, the clamp guide 16, the induction holes 14, and the clamp drivers 12 at the central area of the body 24. The clamp drivers 12 move the clamps 18 up and down along a displacement vector D1 through the induction holes 14 and the clamp guide 16. The clamps 18 may be respectively brought into contact with the force-receiving patterns 138 of the probe card 150. The head body 24 may have head connectors 28 in the peripheral area of the body 24. The head connectors 28 of the head body 24 may be respectively brought into contact with the probe connectors 124 of the probe card 142. The information processor 104 may be electrically connected to the head body 24 and the substrate mover 108. The information processor 104 may be electrically connected to the head body 24, the probe station 106, and the substrate mover 108.

Figure 12:
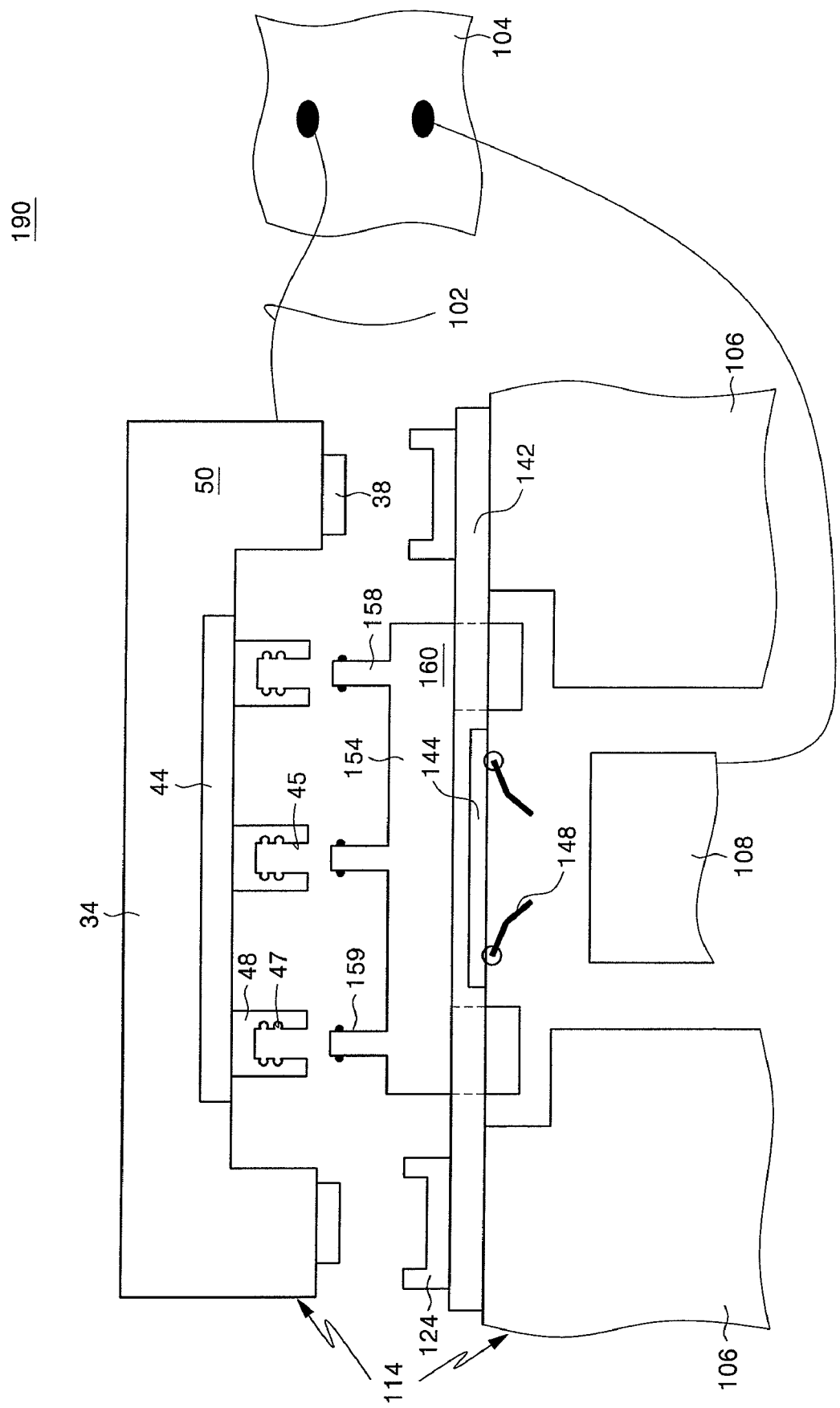

Referring to FIGS. 1, 6, 7 and 12, a substrate test probing equipment 190 according to an exemplary embodiment of the present invention includes the substrate testing equipment 114 of FIG. 3 and the probe card 160 of FIG. 9 as shown in FIG. 12. The probe card 160 may be disposed between the probe station 106 and the test head 50. The probe card 160 may have the force-receiving plate 154 and the pin-supporting plate 144 at the central area of the card 160. The pin-supporting plate 144 may be located on the lower surface of the probe card 142 and have the probe pins 148. The probe pins 148 may be directed downwardly toward the substrate mover 108. The force-receiving plate 154 passes through the upper surface and the lower surface of the probe card 142 and has the force-receiving patterns 158 over the upper surface of the probe card 142. The probe card 160 has probe connectors 124 in the peripheral area of the card 160. The probe card 160 may have fixing members (not shown) that are brought into contact with the probe station 106 so as to prevent the probe station 106 from moving when the semiconductor substrate is electrically tested.

The test head 50 may have a head body 34. The head body 34 has the resisting clamps 48 and the displacement-resisting plate 44 at the central area of the body 34. The displacement-resisting plate 44 may apply a physical force to the resisting clamps 48. The clamp pits 47 of the grooves 45 of the resisting clamps 48 may be respectively brought into contact with the engagers 159 of the force-receiving patterns 158 of the probe card 160. The head body 34 may have the head connectors 38 in the peripheral area of the body 34. The head connectors 38 of the head body 34 may be respectively brought into contact with the probe connectors 124 of the probe card 160. The information processor 104 may be electrically connected to the head body 34 and the substrate mover 108. And the information processor 104 may be electrically connected to the head body 34, the probe station 106, and the substrate mover 108.

Figure 13:
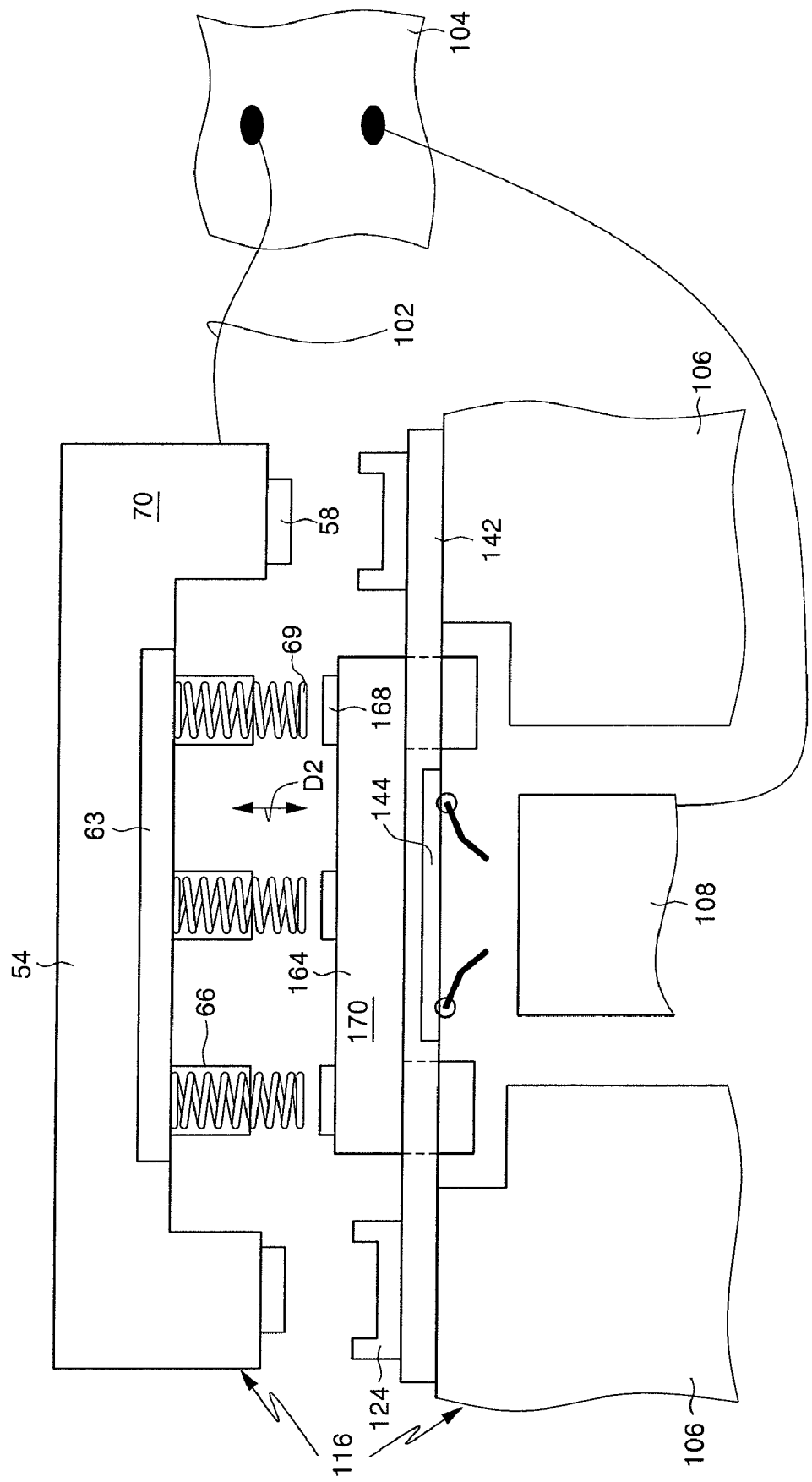

Referring to FIGS. 1, 6, 7, and 13, a substrate test probing equipment 200 according to an exemplary embodiment of the present invention includes the substrate testing equipment 116 of FIG. 4 and the probe card 170 of FIG. 10, as shown in FIG. 13. The probe card 170 may be disposed between the probe station 106 and the test head 70. The probe card 170 may have the force-receiving plate 164 and the pin-supporting plate 144 at the central area of the probe card 170. The pin-supporting plate 144 may be located on the lower surface of the probe card 142 and have the probe pins 148. The probe pins 148 may be directed downwardly toward the substrate mover 108. The force-receiving plate 164 passes through the upper surface and the lower surface of the probe card 142 and has the force-receiving patterns 168 over the upper surface of the probe card 142. The probe card 170 has the probe connectors 124 in the peripheral area of the card 170. The probe card 170 may have fixing members (not shown) that are brought into contact with the probe station 106 so as to prevent the probe station 106 from moving when the semiconductor substrate is electrically tested.

The test head 70 may have the head body 54. The head body 54 has the transformable elastic bodies 69, the induction cylinders 66, and the elasticity resisting plate 63 at the central area of the body 54. The elasticity resisting plate 63 may apply a physical force to the transformable elastic bodies 69 to move the transformable elastic bodies 69 up and down along the displacement vector D2. The transformable elastic bodies 69 may be respectively brought into contact with the force-receiving patterns 168 of the probe card 170. The head body 54 may have the head connectors 58 in the peripheral area of the body 54. The head connectors 58 of the head body 54 may be respectively brought into contact with the probe connectors 124 of the probe card 170. And the information processor 104 may be electrically connected to the head body 54 and the substrate mover 108. The information processor 104 may be electrically connected to the head body 54, the probe station 106, and the substrate mover 108.

Figure 14:
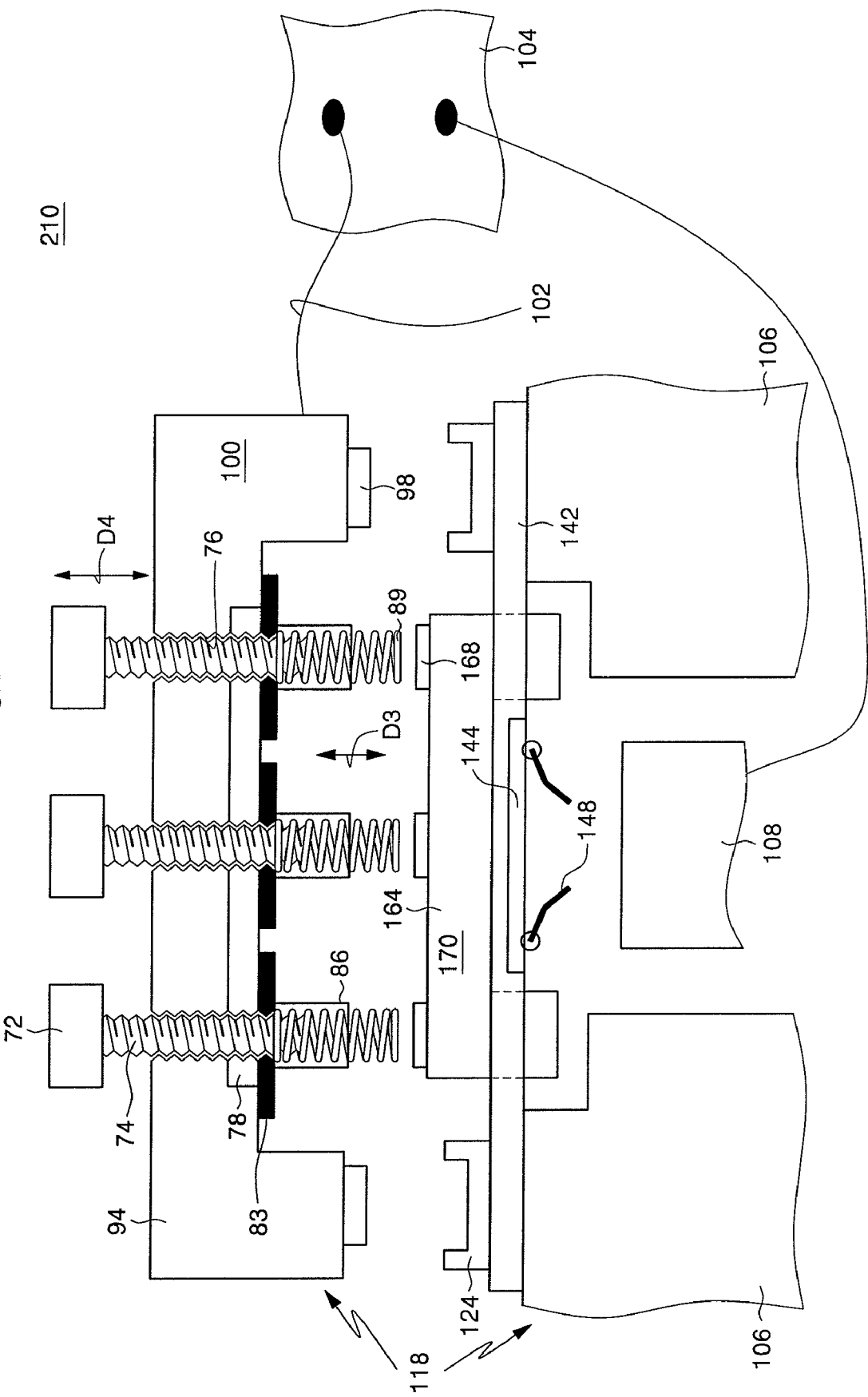

Referring to FIGS. 1, 6, 7, and 14, a substrate test probing equipment 210 according to an exemplary embodiment of the present invention includes the substrate testing equipment 118 of FIG. 5 and the probe card 170 of FIG. 10 as shown in FIG. 14. The probe card 170 may be disposed between the probe station 106 and the test head 100. The probe card 170 may have the force-receiving plate 164 and the pin-supporting plate 144 at the central area of the card 170. The pin-supporting plate 144 may be located on the lower surface of the probe card 142 and have the probe pins 148. The probe pins 148 may be directed downwardly toward the substrate mover 108. The force-receiving plate 164 passes through the upper surface and the lower surface of the probe card 142 and has the force-receiving patterns 168 over the upper surface of the probe card 142. The probe card 170 has probe connectors 124 in the peripheral area of the card 170. The probe card 170 may have fixing members (not shown) that are brought into contact with the probe station 106 so as to prevent the probe station 106 from moving when the semiconductor substrate is electrically tested.

The test head 100 may have a head body 94. The head body 94 may have the displacement elastic bodies 89, the protection cylinders 86, the displacement controller 78, the displacement sensors 83, the displacement adjusting holes 76, the displacement adjustors 74, and the displacement drivers 72 at the central area of the head body 94. The displacement drivers 72 may have their functions adjusted by the displacement sensors 83 and the displacement controller 78. The displacement sensors 83 and the displacement controller 78 can calculate a displacement amount of the displacement elastic bodies 69 along a displacement vector D3. Accordingly, the displacement drivers 72 may apply a rotary motion to the displacement adjustors 74 so that the displacement adjustors 74 pass through the displacement adjusting holes 76 in the direction of the displacement vector D4. The displacement elastic bodies 89 may be respectively brought into contact with the force-receiving patterns 168 of the probe card 170. The head body 94 may have the head connectors 98 in the peripheral area of the body 94. The head connectors 98 of the head body 94 may be respectively brought into contact with the probe connectors 124 of the probe card 170. The information processor 104 may be electrically connected to the head body 94 and the substrate mover 108. The information processor 104 may be electrically connected with the head body 94, the substrate mover 108, and also with the probe station 106, although not shown.

A method of using the substrate test probing equipment having the force-receiving pattern for the probe card and the forcing part for the test head according to an exemplary embodiment of the present invention will now be described with reference to FIGS. 15 to 19.

FIGS. 15 to 18 are cross-sectional views illustrating an exemplary embodiment of a method of using the substrate test probing equipment of FIGS. 11 to 14, and FIG. 19 is a graph illustrating an electrical test result according to an exemplary embodiment of a method of using the substrate test probing equipment of FIGS. 11 to 14.

Figure 15:
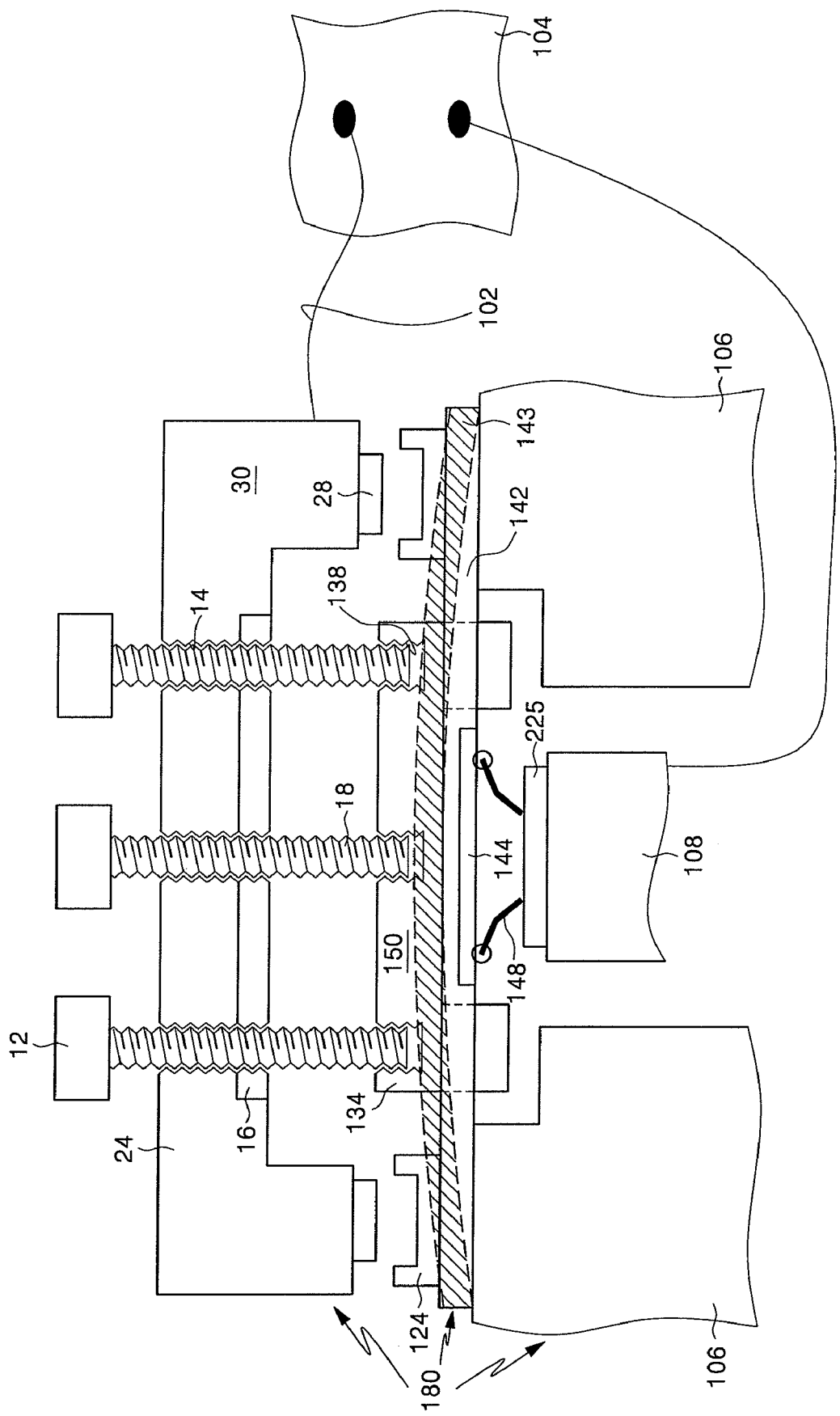
FIGS. 15 to 18 are cross-sectional views illustrating a method of using a substrate test probing equipment of FIGS. 11 to 14.

Referring to FIGS. 11 and 15, the substrate test probing equipment 180 of FIG. 11 according to an exemplary embodiment of the present invention is prepared as shown in FIG. 15. The substrate test probing equipment 180 may have the test head 30, the probe station 106, the substrate mover 108 and the probe card 150. The probe card 150 and the test head 30 have been described in FIGS. 1, 2, 8, and 11. Accordingly, the probe card 150 has the probe connectors 124, the force-receiving plate 134, the circuitry plate 142, and the pin-supporting plate 144. The pin-supporting plate 144 may have the probe pins 148. The force-receiving plate 134 may have the force-receiving patterns 138 of a concave (female) shape. The probe card 150 may be placed on the probe stage 106. The test head 30 may have the head connectors 28, the head body 24, the clamps 18, the clamp guide 16, the induction holes 14, and the clamp drivers 12.

The test head 30 may be separated from the probe card 150 to expose the probe card 150. The probe card 150 may be separated from the substrate test probing equipment 180 to expose the substrate mover 108. The substrate mover 108 may be placed at a reference position in the probe station 106. The semiconductor substrate 225 may be safely placed on the substrate mover 108. The probe card 150 may be located on the semiconductor substrate 225. The probe card 150 may be located to be fixed to the probe station 106. The test head 30 may be brought into contact with the probe card 150. The head connectors 28 of the test head 30 may be brought into contact with the probe connectors 124 of the probe card 150. In addition, the clamps 18 of the test head 30 are brought into contact with the force-receiving patterns 138 of the probe card 150 through the clamp drivers 12 and may apply a physical force to the force-receiving patterns 138 of the probe card 150. Accordingly, the test head 30 and the probe card 150 may be fixed to each other.

Referring back to FIGS. 11 and 15, geometric information of the probe card 150 relative to the semiconductor substrate 225 is obtained by using the optical camera (not shown) of the substrate mover 108. The geometric information may be horizontal and vertical position relationship between the semiconductor substrate 225 and the probe card 150. The optical camera may send the geometric information to the information processor 104 via at least one of the substrate mover 108 and the test head 30. The information processor 104 may add or subtract an allowable error to or from the geometric information and send the geometric information±allowable error of the probe card 150 to at least one of the substrate mover 108 and the test head 30. The geometric information±allowable error of the probe card 150 may be reference data for suppressing thermal expansion of the probe card 150.

Heat may be applied to the substrate mover 108. The substrate mover 108 moves in the probe station 106 so that the semiconductor substrate 225 is brought into contact with the probe pins 148 of the pin-supporting plate 144. The contact between the probe pins 148 and the semiconductor substrate 225 may be made with the geometric information±allowable error of the probe card 150. A power voltage may be supplied from the information processor 104 to the test head 30, the probe card 150, and the semiconductor substrate 225 for the electrical test of the semiconductor substrate 225. When the semiconductor substrate 225 is being electrically tested, the optical camera (not shown) may check the thermal expansion of the probe card 150 and send the results of the checking, that is, image information, represented at 143 to at least one of the substrate mover 108 and the test head 30. At least one of the substrate mover 108 and the test head 30 may block the power voltage from the information processor 104.

Again referring back to FIGS. 11 and 15, the at least one of the substrate mover 108 and the test head 30 may check a degree of thermal expansion of the probe card 150 based on the image information 143 and obtain a transformation value. The at least one of the substrate mover 108 and the test head 30 may compare the transformation value of the probe card 150 with the geometric information±allowable error thereof. When the transformation value of the probe card 150 is smaller than the geometric information±allowable error, the power voltage may be supplied from the information processor 104 to the test head 30, the probe card 150, and the semiconductor substrate 225. On the other hand, when the transformation value of the probe card 150 is greater than the geometric information±allowable error thereof, the at least one of the substrate mover 108 and the test head 30 obtains an amendment value between the transformation value and the geometric information±allowable error. The at least one of the substrate mover 108 and the test head 30 applies an additional physical force corresponding to the amendment value to the clamps 18 of the test head 30 so that the clamps 18 of the test head 30 are kept in contact with the force-receiving patterns 138 of the probe card 150.

The power voltage may continue to be supplied from the information processor 104 to the test head 30, the probe card 150, and the semiconductor substrate 225. The at least one of the probe card 150 and the test head 30 may send an electrical signal generated from the semiconductor substrate 225 to the information processor 104. After the semiconductor substrate 225 is electrically tested, the test head 30 may be separated from the probe card 142 to expose the probe card 142. The probe card 142 may be separated from the substrate test probing equipment 180 to expose the semiconductor substrate 225. The semiconductor substrate 225 may then be detached from the substrate mover 108.

Figure 16:
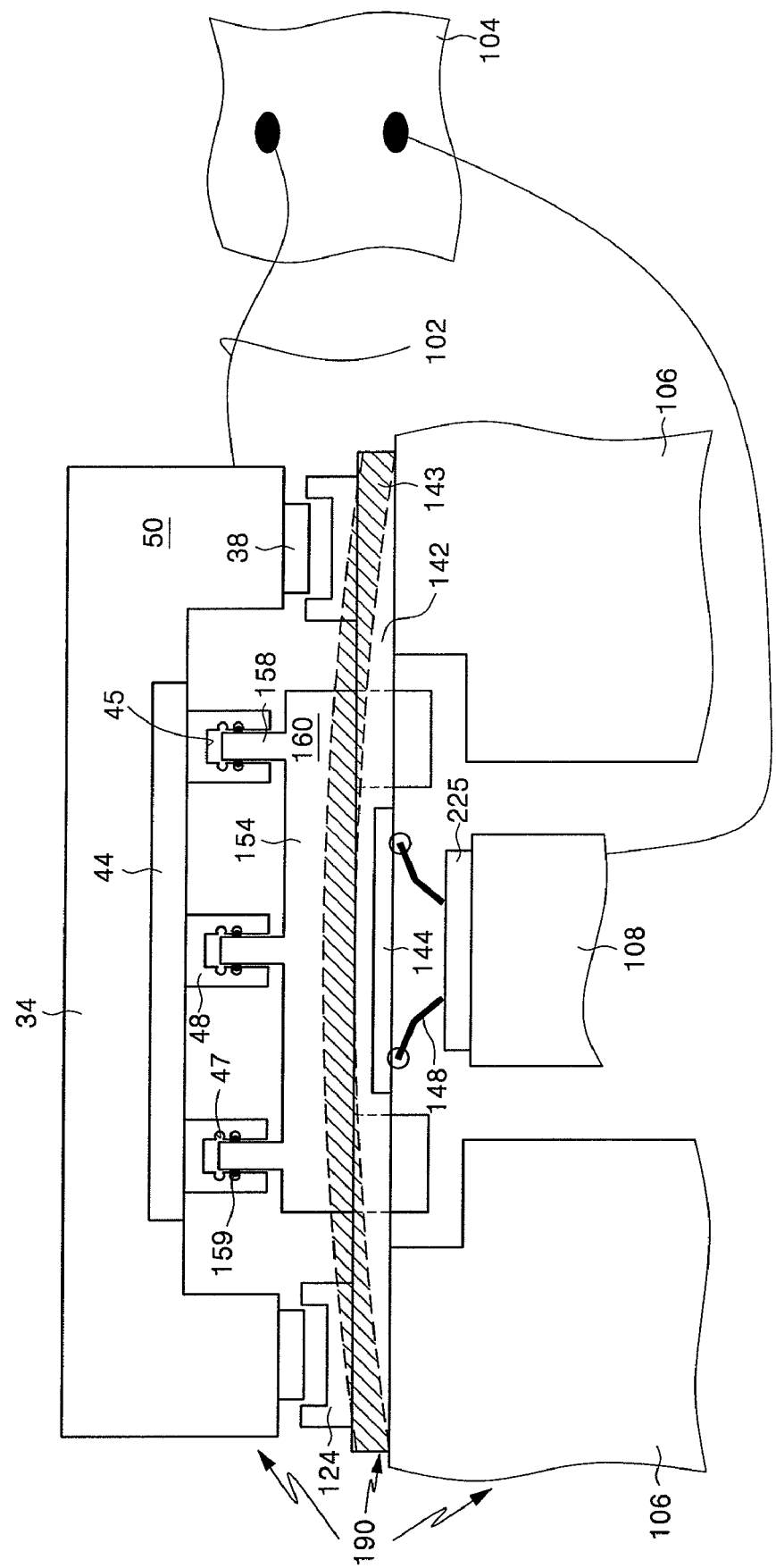

Referring to FIGS. 12 and 16, the substrate test probing equipment 190 of FIG. 12 according to an exemplary embodiment of the present invention is prepared as shown in FIG. 16. The substrate test probing equipment 190 may have the test head 50, the probe station 106, the substrate mover 108 and the probe card 160. The probe card 160 and the test head 50 have been described in FIGS. 1, 3, 9 and 12. Accordingly, the probe card 160 has the probe connectors 124, the force-receiving plate 154, the circuitry plate 142, and the pin-supporting plate 144. The pin-supporting plate 144 may have the probe pins 148. The force-receiving plate 154 may have the force-receiving patterns 158 of a convex (male) shape. The probe card 160 may be placed on the probe stage 106. The test head 50 may have the head body 34, the head connectors 38, the displacement-resisting plate 44, and the resisting clamps 48.

A procedure of electrically testing the semiconductor substrate 225 by using the test head 50 and the probe card 160 may be performed similarly as described in relation to FIG. 15. In the substrate test probing equipment 190 according to an exemplary embodiment of the present invention, however, the head connectors 38 of the test head 50 may be brought into contact with the probe connectors 124 of the probe card 160. The engagers 159 of the force-receiving patterns 158 of the probe card 160 may be brought into contact with the lower clamp pits 47 of the grooves 45 of the resisting clamps. When the semiconductor substrate 225 is being electrically tested, the optical camera (not shown) of the substrate mover 108 may check the thermal expansion of the probe card 160 and send the results of the checking, that is, image information, represented at 143 to at least one of the substrate mover 108 and the test head 50. The optical camera may be electrically connected with at least one of the substrate mover 108 and the head body 34.

At least one of the substrate mover 108 and the test head 50 may compare the image information 143 from the probe card 160 with geometric information±allowable error of the probe card 160 to block or supply a power voltage from the information processor 104. The comparison between the image information 143 and the geometric Information ± allowable error may be performed as described in relation to FIG. 15. Further, when an amendment value is required, the information processor 104 brings the engagers 159 of the force-receiving patterns 158 of the probe card 160 into contact with the upper clamp pits 47 of the grooves 45 of the resisting clamps 48, so that the test head 50 is closer to the probe card 160. This can forcibly suppress thermal expansion of the probe card 160.

Figure 17:
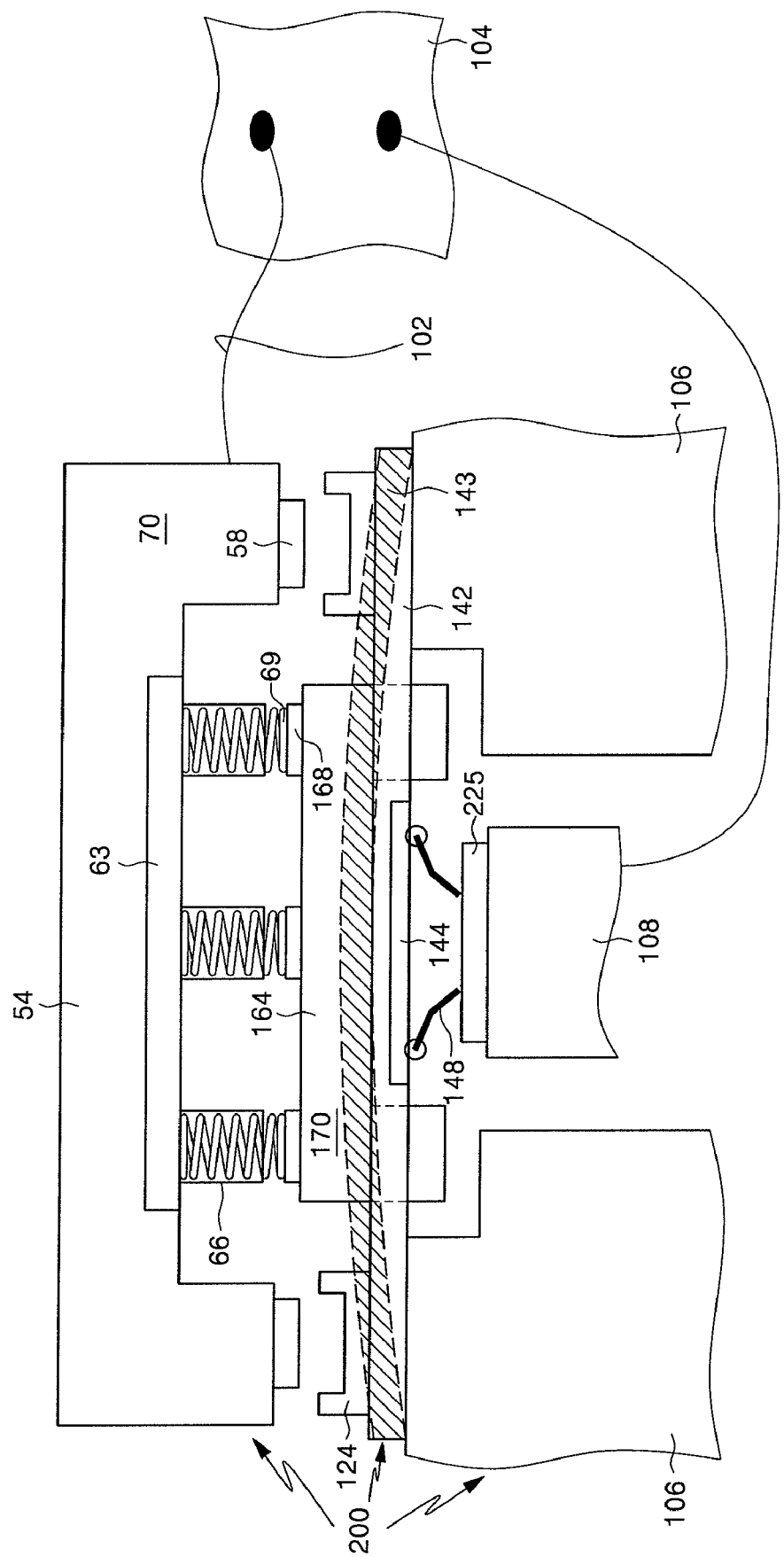

Referring to FIGS. 13 and 17, the substrate test probing equipment 200 of FIG. 13 according to an exemplary embodiment of the present invention is prepared as shown in FIG. 17. The substrate test probing equipment 200 may have the test head 70, the probe station 106, the substrate mover 108 and the probe card 170. The probe card 170 and the test head 70 have been described in relation to FIGS. 1, 4, 10 and 13. Accordingly, the probe card 170 may have the probe connectors 124, the force-receiving plate 164, the circuitry plate 142, and the pin-supporting plate 144. The pin-supporting plate 144 may have the probe pins 148. The force-receiving plate 164 may have the force-receiving patterns 168 located on a surface thereof. The probe card 170 may be placed on the probe stage 106. The test head 70 may have the head body 54, the head connectors 58, the elasticity resisting plate 63, the induction cylinders 66, and the transformable elastic bodies 69.

A procedure of electrically testing the semiconductor substrate 225 by using the test head 70 and the probe card 170 may be performed similarly as described in relation to FIG. 15. In the substrate test probing equipment 200 according to an exemplary embodiment of the present invention, however, the head connectors 58 of the test head 70 may be brought into contact with the probe connectors 124 of the probe card 170. The force-receiving patterns 168 of the probe card 170 may be respectively brought into contact with the transformable elastic bodies 69. When the semiconductor substrate 225 is being electrically tested, the optical camera (not shown) of the substrate mover 108 may check the thermal expansion of the probe card 170 and send the results of the checking, that is, image information represented at 143 to at least one of the substrate mover 108 and the test head 70. The optical camera may be electrically connected with at least one of the substrate mover 108 and the test head 70.

At least one of the substrate mover 108 and the test head 70 may compare the image information 143 from the probe card 170 with geometric information±allowable error of the probe card 170 to block or supply a power voltage from the information processor 104. The comparison between the image information 143 and the geometric information±allowable error may be performed as in FIG. 15. Furthermore, when an amendment value is required, the information processor 104 may apply an additional physical force to the transformable elastic bodies so that the test head 70 is closer to the probe card 170. This can forcibly suppress thermal expansion of the probe card 170.

Figure 18:
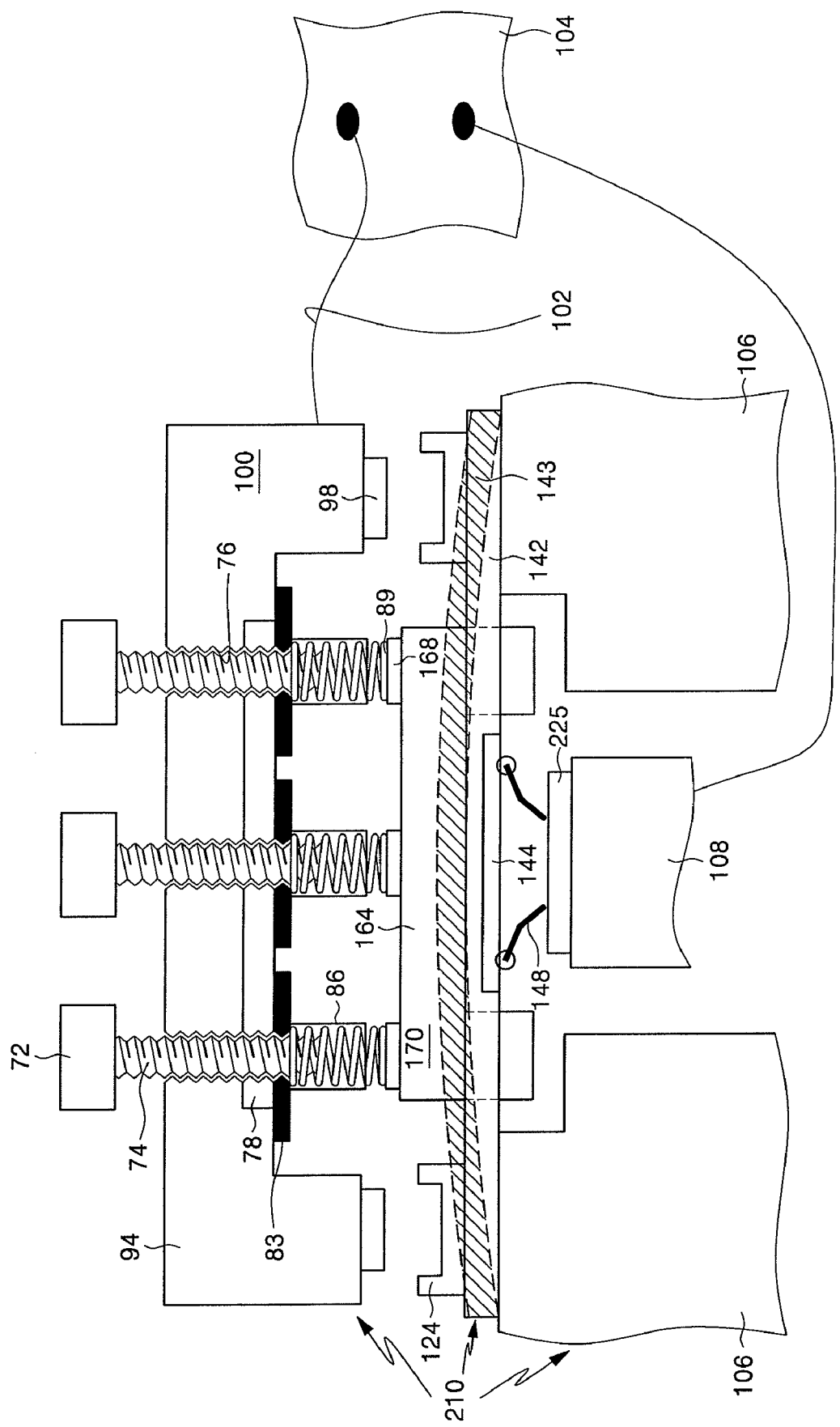

Referring to FIGS. 14 and 18, the substrate test probing equipment 210 of FIG. 14 according to an exemplary embodiment of the present invention is prepared as shown in FIG. 18. The substrate test probing equipment 210 may have the test head 100, the probe station 106, the substrate mover 108, and the probe card 170. The probe card 170 and the test head 100 have been described in FIGS. 1, 5, 10 and 14. Accordingly, the probe card 170 may have the probe connectors 124, the force-receiving plate 164, the circuitry plate 142, and the pin-supporting plate 144. The pin-supporting plate 144 may have the probe pins 148. The force-receiving plate 164 may have the force-receiving patterns 168 located on a surface thereof. The probe card 170 may be placed on the probe stage 106. The test head 100 may have the displacement drivers 72, the displacement adjustors 74, the displacement adjusting holes 76, the displacement controller 78, the displacement sensors 83, the protection cylinders 86, the displacement elastic bodies 89, the head body 94 and the head connectors 98.

A procedure of electrically testing the semiconductor substrate 225 by using the test head 100 and the probe card 170 may be performed similarly as in FIG. 15. In the substrate test probing equipment 210 according to this exemplary embodiment of the present invention, however, the head connectors 98 of the test head 100 may be brought into contact with the probe connectors 124 of the probe card 170. The force-receiving patterns 168 of the probe card 170 may be respectively brought into contact with the displacement elastic bodies 89. When the semiconductor substrate 225 is being electrically tested, the optical camera (not shown) of the substrate mover 108 may serve as a displacement sensor 83. Specifically, the optical camera may check an analog displacement amount of the displacement elastic body 89 and send image information represented at 143 to the information processor 104. The information processor 104 may analyze the image information and send a digital displacement amount of the displacement elastic bodies 89 to at least one of the head body 94 and the substrate mover 108. The at least one of the head body 94 and the substrate mover 108 may control the displacement driver 72 based on the digital displacement amount of the displacement elastic bodies 89. When an amendment value is required, the displacement driver 72 may apply a physical force corresponding to the digital displacement amount of the displacement elastic bodies 89, to the displacement elastic bodies 89 so that the test head 100 is closer to the probe card 170.

On the contrary, in the substrate test probing equipment 210 according to exemplary embodiments of the present invention, when the semiconductor substrate 225 is being electrically tested, the displacement controller 78 can check the thermal expansion of the probe card. In this case, the displacement controller 78 may be electrically connected with the displacement driver 72. The displacement controller 78 may calculate the displacement amount of the displacement elastic bodies 89 through the displacement sensor 83. When an amendment value is required, the displacement driver 72 may apply a physical force corresponding to the displacement amount of the displacement elastic bodies 89 to the displacement adjustors 74 through the displacement controller 78, so that the test head 100 is closer to the probe card 170. This can forcibly suppress thermal expansion of the probe card 170 through the displacement controller 78 and the optical camera (not shown).

Figure 19:
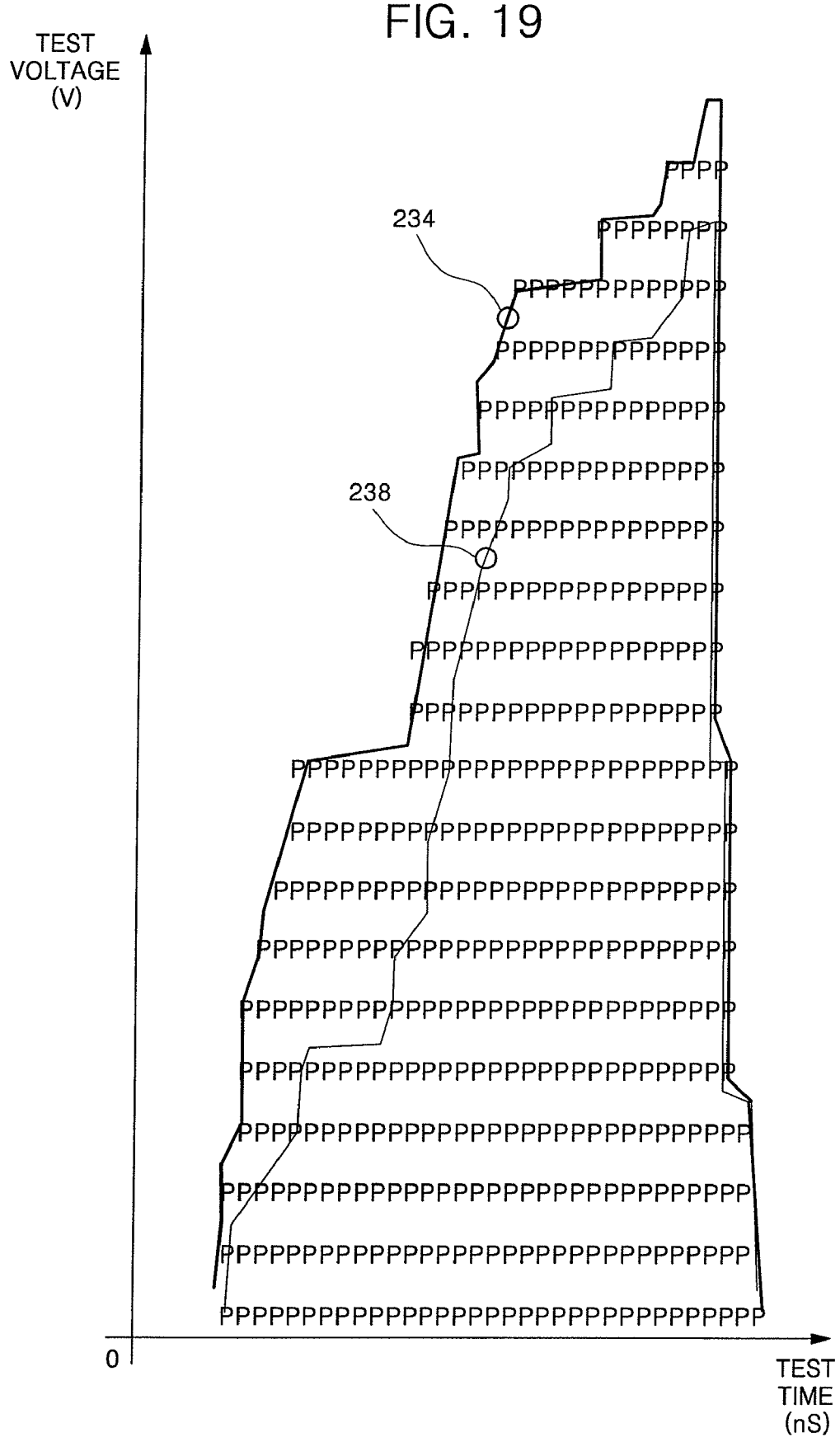
FIG. 19 is a graph illustrating an electrical test result according to a method of using a substrate test probing equipment of FIGS. 11 to 14.

Referring to FIG. 19, the respective substrate test probing equipment 180, 190, 200, and 210 of FIG. 11, 12, 13, or 14, respectively, according to exemplary embodiments of the present invention may show a result of electrically testing the semiconductor substrate 225 through the information processor 104. The information processor 104 may display a wanted circuitry function from a selected semiconductor device in the semiconductor substrate 225, on a graph having a test time on an x-axis, and a test voltage on a y-axis. In this case, the information processor 104 may display the circuitry function of the selected semiconductor device by using two loci 234 and 238 depending on whether the probe card 142 is thermally expanded or not.

First, when the probe card 142 is thermally expanded, the probe card 142 may cause the probe pins 148 to be separated from the semiconductor substrate 225. Accordingly, the information processor 104 cannot apply a sufficient voltage to the semiconductor substrate 225 via the test head 30, 50, 70 or 100 and the probe card 142. As a result, the information processor 104 may display the locus 238 of an unwanted circuitry function from the selected semiconductor device in the semiconductor substrate 225. On the other hand, when the thermal expansion of the probe card 142 is forcibly suppressed, the probe card 142 can be electrically connected with the semiconductor substrate 225 via the probe pins 148. Accordingly, the information processor 104 can apply the sufficient voltage to the semiconductor substrate 225 via the test head 30, 50, 70 or 100 and the probe card 142. As a result, the information processor 104 may display the locus 234 of the wanted circuitry function from the selected semiconductor device in the semiconductor substrate 225.

As described above, exemplary embodiments of the present invention provide the substrate test probing equipment having the force-receiving pattern for the probe card and the forcing part for the test head, and the methods of using the same. According to the exemplary embodiments of present invention, the thermal expansion of the probe card can be suppressed while the semiconductor substrate is tested at a high temperature, using the force-receiving pattern for the probe card and the forcing part for the test head.

The invention has been described using exemplary embodiments, however, it is to be understood that the scope of the invention is not limited to the disclosed exemplary embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A substrate test probing equipment comprising:
   a substrate mover having an upper surface;
   a test head having a resisting plate located over the upper surface of the substrate mover, and a forcing part facing the substrate mover to be brought into contact with and extend from the resisting plate;
   a probe card disposed between the test head and the substrate mover and including a circuitry plate having upper and lower surfaces, a force-receiving plate, and a pin-supporting plate, the force-receiving plate having a force-receiving pattern in one of concave and convex shapes over the upper surface of the circuitry plate, being fixed to the upper surface of the circuitry plate, and passing through the upper and lower surfaces of the circuitry plate, and the pin-supporting plate being located on the lower surface of the circuitry plate, being surrounded by the force-receiving plate, and being electrically connected to the circuitry plate; and
   an information processor electrically connected with the probe card, the test head, and the substrate mover, wherein
   the force-receiving plate corresponds positionally to the resisting plate, the force-receiving pattern is brought into contact with the forcing part, and the forcing part applies a physical force to the force-receiving pattern.

2. The equipment according to claim 1, wherein the pin-supporting plate has probe pins, the force-receiving plate has a surface extending in parallel with the upper surface of the circuitry plate and having concave and convex shapes, the force-receiving pattern has the concave shape, and the circuitry plate has semiconductor discrete devices and interconnections for electrically connecting the semiconductor discrete devices.

3. The equipment according to claim 1, wherein the pin-supporting plate has probe pins, the force-receiving plate has a surface extending in parallel with the upper surface of the circuitry plate and having concave and convex shapes, the force-receiving pattern has the convex shape, and the circuitry plate has semiconductor discrete devices and interconnections for electrically connecting the semiconductor discrete devices.

4. The equipment according to claim 1, wherein the pin-supporting plate has probe pins, the force-receiving plate has a surface extending in parallel with the upper surface of the circuitry plate, the force-receiving pattern is located on the surface of the force-receiving plate, and the circuitry plate has semiconductor discrete devices and interconnections for electrically connecting the semiconductor discrete devices.

5. The equipment according to claim 1, further comprising a head body in the test head,
   wherein the resisting plate is located in and fixed to the head body, the forcing part comprises a clamp driver, a clamp and an induction hole, the induction hole passes through the resisting plate and the head body, the clamp moves up and down in the resisting plate and the head body through the induction hole, the clamp driver applies a physical force to the clamp, the resisting plate serves as a clamp guide for allowing the clamp to move up and down, and the clamp guide is electrically connected with at least one of the substrate mover and the head body and with the clamp driver.

6. The equipment according to claim 1, further comprising a head body in the test head,
   wherein the forcing part comprises a resisting clamp located beneath the resisting plate and having a concave part and a clamp pit formed on sidewalls of the concave part, the resisting plate is fixed to the head body for serving as a displacement-resisting plate, and the displacement-resisting plate is electrically connected with at least one of the substrate mover and the head body for applying a physical force to the resisting clamp.

7. The equipment according to claim 1, further comprising a head body in the test head,
   wherein the forcing part is located beneath the resisting plate and comprises an induction cylinder and a transformable elastic body, the transformable elastic body is located inside the induction cylinder and protrudes from the induction cylinder, the resisting plate is fixed to the head body for serving as an elasticity resisting plate, and the elasticity resisting plate is electrically connected with at least one of the substrate mover and the head body for applying a physical force to the transformable elastic body.

8. The equipment according to claim 1, further comprising a head body in the test head,
   wherein the resisting plate is located in and fixed to the head body, the forcing part comprises a displacement driver, a displacement adjustor, a displacement adjusting hole, a displacement sensor, a protection cylinder, and a displacement elastic body, the displacement elastic body, the protection cylinder and the displacement sensor are located beneath the resisting plate, the displacement elastic body is located inside and protrudes from the protection cylinder, the displacement sensor is electrically connected with the displacement elastic body, the displacement adjusting hole passes through the displacement sensor, the resisting plate and the head body, the displacement adjustor moves up and down in the resisting plate and the head body through the displacement adjusting hole, the resisting plate is electrically connected with at least one of the substrate mover and the test head and with the displacement sensor for serving as a displacement controller, the displacement controller is electrically connected with the displacement driver, and the displacement driver applies a physical force to the displacement adjustor.

9. The equipment according to claim 1, further comprising a head body in the test head,
   wherein the resisting plate is located in and fixed to the head body, the forcing part comprises a displacement driver, a displacement adjustor, a displacement adjusting hole, a displacement sensor, a protection cylinder, and a displacement elastic body, the displacement elastic body, the protection cylinder and the displacement sensor are located beneath the resisting plate, the displacement elastic body is located inside and protrudes from the protection cylinder, the displacement sensor is electrically connected with the displacement elastic body, the displacement adjusting hole passes through the displacement sensor, the resisting plate and the head body, the displacement adjustor moves up and down in the displacement sensor, the resisting plate and the head body through the displacement adjusting hole, the at least one of the substrate mover and the test head is electrically connected with the displacement sensor and the displacement driver, and the displacement driver applies a mechanical force to the displacement adjustor.

10. The equipment according to claim 1, wherein a plurality of forcing parts and a plurality of force-receiving patterns are disposed on the resisting plate and the force-receiving plate, respectively, and the plurality of forcing parts and the plurality of force-receiving patterns are the same in number.

11. A method of using substrate test probing equipment including a substrate mover, a test head located over the substrate mover, a probe card located between the test head and the substrate mover, and an information processor electrically connected with the probe card, the test head and the substrate mover, the method comprising:
   separating the test head from the probe card to expose the probe card, the test head having a resisting plate located over the substrate mover, and a forcing part facing the substrate mover to be brought into contact with and extend from the resisting plate;
   separating the probe card from the substrate test probing equipment to expose the substrate mover, the probe card including a circuitry plate having upper and lower surfaces, a force-receiving plate, and a pin-supporting plate, the force-receiving plate having a force-receiving pattern in one of concave and convex shapes over the upper surface of the circuitry plate, being fixed to the upper surface of the circuitry plate, and passing through the upper and lower surfaces of the circuitry plate, and the pin-supporting plate being located on the lower surface of the circuitry plate, being surrounded by the force-receiving plate, and being electrically connected to the circuitry plate;
   placing a semiconductor substrate on the substrate mover;
   sequentially stacking the probe card and the test head on the test probing equipment so that the probe card and the test head are located on and electrically connected with the semiconductor substrate, the forcing part of the test head being brought into contact with the force-receiving pattern of the probe card for applying a mechanical force to the force-receiving pattern of the probe card; and
   electrically testing the semiconductor substrate using the information processor.

12. The method according to claim 11, further comprising applying heat to the substrate mover prior to electrically testing the semiconductor substrate.

13. The method according to claim 12, wherein at least one of the substrate mover and the test head has geometric information plus-or-minus an allowable error of the probe card relative to the semiconductor substrate after the probe card is placed on the substrate test probing equipment; and
   the geometric information plus-or-minus allowable error of the probe card is a value measured prior to applying the heat to the semiconductor substrate, and electrically connecting the probe card and the semiconductor substrate is made with the geometric information plus-or-minus allowable error of the probe card.

14. The method according to claim 13, wherein electrically testing the semiconductor substrate comprises:
   supplying a power voltage to the test head, the probe card and the semiconductor substrate by using the information processor;
   checking thermal expansion of the probe card by using the at least one of the substrate mover and the test head and blocking the power voltage from being supplied by the information processor when the semiconductor substrate is being electrically tested;

checking a degree of the thermal expansion of the probe card and obtaining a transformation value of the probe card by using the at least one of the substrate mover and the test head;

comparing the transformation value of the probe card with the geometric information plus-or-minus the allowable error by using the at least one of the substrate mover and the test head;

in case that the transformation value of the probe card is smaller than the geometric information plus-or-minus the allowable error, supplying the power voltage from the information processor to the test head, the probe card and the semiconductor substrate; and sending an electrical signal generated from the semiconductor substrate to the information processor by using the probe card and the test head.

15. The method according to claim 13, wherein electrically testing the semiconductor substrate comprises:

supplying a power voltage to the test head, the probe card and the semiconductor substrate by using the information processor;

checking thermal expansion of the probe card by using the at least one of the substrate mover and the test head and blocking the power voltage from being supplied by the information processor when the semiconductor substrate is being electrically tested;

checking a degree of the thermal expansion of the probe card by using the at least one of the substrate mover and the test head and obtaining a transformation value of the probe card;

comparing, by using the at least one of the substrate mover and the test head, the transformation value of the probe card with the geometric information plus-or-minus the allowable error, and obtaining an amendment value between the transformation value and the geometric information plus-or-minus the allowable error when the transformation value of the probe card is greater than the geometric information plus-or-minus the allowable error;

applying an additional mechanical force corresponding to the amendment value by using the at least one of the substrate mover and the test head, to the forcing part of the test head so that the forcing part of the test head is kept in contact with the force-receiving pattern of the probe card;

supplying the power voltage from the information processor to the test head, the probe card and the semiconductor substrate; and sending an electrical signal generated from the semiconductor substrate to the information processor by using the probe card and the test head.

16. The method according to claim 13, wherein the force-receiving plate has a surface extending in parallel with the upper surface of the circuitry plate and having concave and convex shapes, the force-receiving pattern has the concave shape, and the circuitry plate has semiconductor discrete devices and interconnections for electrically connecting the semiconductor discrete devices.

17. The method according to claim 13, wherein the force-receiving plate has a surface extending in parallel with the upper surface of the circuitry plate and having concave and convex shapes, the force-receiving pattern has the convex shape, and the circuitry plate has semiconductor discrete devices and interconnections for electrically connecting the semiconductor discrete devices.

18. The method according to claim 13, wherein the force-receiving plate has a surface extending in parallel with the upper surface of the circuitry plate, the force-receiving pattern is located on the surface of the force-receiving plate, and the circuitry plate has semiconductor discrete devices and interconnections for electrically connecting the semiconductor discrete devices.

19. The method according to claim 13, wherein the test head further comprises a head body; and the resisting plate is located in and fixed to the head body, the forcing part includes a clamp driver, a clamp and an induction hole, the induction hole passes through the resisting plate and the head body, the clamp moves up and down in the resisting plate and the head body through the induction hole, the clamp driver applies a mechanical force to the clamp, the resisting plate serves as a clamp guide for allowing the clamp to move up and down, and the clamp guide is electrically connected with at least one of the substrate mover and the head body and with the clamp driver.

20. The method according to claim 13, wherein the test head further comprises a head body; and the forcing part includes a resisting clamp located beneath the resisting plate and having a concave part and a clamp pit formed on sidewalls of the concave part, the resisting plate is fixed to the head body for serving as a displacement-resisting plate, and the displacement-resisting plate is electrically connected with at least one of the substrate mover and the head body for applying a mechanical force to the resisting clamp.

21. The method according to claim 13, wherein the test head further comprises a head body; and the forcing part is located beneath the resisting plate and includes an induction cylinder and a transformable elastic body, the transformable elastic body is located inside the induction cylinder and protrudes from the induction cylinder, the resisting plate is fixed to the head body for serving as an elasticity resisting plate, and the elasticity resisting plate is electrically connected with at least one of the substrate mover and the head body for applying a mechanical force to the transformable elastic body.

22. The method according to claim 13, wherein the test head further comprises a head body; and the resisting plate is located in and fixed to the head body, the forcing part includes a displacement driver, a displacement adjustor, a displacement adjusting hole, a displacement sensor, a protection cylinder, and a displacement elastic body, the displacement elastic body, the protection cylinder and the displacement sensor are located beneath the resisting plate, the displacement elastic body is located inside and protrudes from the protection cylinder, the displacement sensor is electrically connected with the displacement elastic body, the displacement adjusting hole passes through the displacement sensor, the resisting plate and the head body, the displacement adjustor moves up and down in the displacement sensor, the resisting plate and the head body through the displacement adjusting hole, the resisting plate is electrically connected with at least one of the substrate mover and the test head and with the displacement sensor for serving as a displacement controller, the displacement controller is electrically connected with the displacement driver, and the displacement driver applies a mechanical force to the displacement adjustor.

23. The method according to claim 13, wherein the test head further comprises a head body; and the resisting plate is located in and fixed to the head body, the forcing part includes a displacement driver, a displacement adjustor, a displacement adjusting hole, a displacement sensor, a protection cylinder, and a displacement elastic body, the displacement elastic body, the protection cylinder and the displacement sensor are located beneath the resisting plate, the displacement elastic body is located inside and protrudes from the protection cylinder, the displacement sensor is electrically connected with the displacement elastic body, the displacement adjusting hole passes through the displacement sensor, the resisting plate and the head body, the displacement adjustor moves up and down in the displacement sensor, the resisting plate and the head body through the displacement adjusting hole, the at least one of the substrate mover and the test head is electrically connected with the displacement sensor and the displacement driver, and the displacement driver applies a mechanical force to the displacement adjustor.

24. The method according to claim 13, wherein the forcing part and the force-receiving pattern are the same in number and are disposed on the resisting plate and the force-receiving plate, respectively.

25. The method according to claim 24, wherein the probe card and the test head have a probe connector and a head connector, respectively, and the pin-supporting plate has a probe pin, wherein connecting the probe card and the test head with the semiconductor substrate comprises:

bringing the probe pin of the probe card into contact with the semiconductor substrate; and bringing the head connector of the test head into contact with the probe connector of the probe card.

26. The method according to claim 25, further comprising:

after electrically testing the semiconductor substrate, separating the test head from the probe card to expose the probe card;

separating the probe card from the substrate test probing equipment to expose the semiconductor substrate; and detaching the semiconductor substrate from the substrate mover.

* * * * *